US012704529B2

(12) United States Patent
Li et al.

(10) Patent No.: US 12,704,529 B2
(45) Date of Patent: Aug. 11, 2026

(54) GALVANOMETER MOTOR

(71) Applicant: SUTENG INNOVATION TECHNOLOGY CO., LTD., Shenzhen (CN)

(72) Inventors: Yipeng Li, Shenzhen (CN); Congcong Zhu, Shenzhen (CN)

(73) Assignee: SUTENG INNOVATION TECHNOLOGY CO., LTD., Shenzhen (CN)

(*) Notice: Subject to any disclaimer, the term of this patent is extended or adjusted under 35 U.S.C. 154(b) by 579 days.

(21) Appl. No.: 18/203,620

(22) Filed: May 30, 2023

(65) Prior Publication Data

US 2023/0384349 A1 Nov. 30, 2023

(30) Foreign Application Priority Data

May 31, 2022 (CN) ......................... 202210605090.1
Sep. 28, 2022 (CN) ......................... 202211189663.3

(51) Int. Cl.

*G01R 5/04* (2006.01)
*H02K 11/215* (2016.01)
*H02K 21/20* (2006.01)
*H02P 6/16* (2016.01)

(52) U.S. Cl.

CPC ............ *G01R 5/04* (2013.01); *H02K 11/215* (2016.01); *H02K 21/20* (2013.01); *H02P 6/16* (2013.01); *H02K 2211/03* (2013.01)

(58) Field of Classification Search

CPC ........ G01R 5/04; H02K 11/215; H02K 21/20; H02K 2211/03; H02K 33/16; H02P 6/16
See application file for complete search history.

(56) References Cited

U.S. PATENT DOCUMENTS 4,302,720 A * 11/1981 Brill ....................... H02K 33/06 359/213.1
6,809,451 B1 * 10/2004 Brown .................. H02K 26/00 310/156.08

FOREIGN PATENT DOCUMENTS

CN 113285538 A * 8/2021 ............... H02K 5/24
CN 215498605 U 1/2022
WO WO-2007137459 A1 * 12/2007 ............ H02K 33/16

* cited by examiner

*Primary Examiner* — Mohamad A Musleh
(74) *Attorney, Agent, or Firm* — BAYES PLLC

(57) ABSTRACT

The present disclosure provides a galvanometer motor, including a stator, a rotor, and a sensor board. The stator includes a housing and a drive coil mounted inside the housing. The rotor includes a rotating shaft and a galvanometer lens. A pair of radially magnetized magnetic poles are at the middle of the rotating shaft, two ends of the rotating shaft are rotatably mounted inside the housing, and one end of the rotating shaft extends outside the housing and is connected to the galvanometer lens. The sensor board is fixed on an inner wall of the housing and is at one end of the housing farther away from the galvanometer lens. The sensor board is mounted with one or more magnetic sensors configured to sense a magnetic field signal generated by the pair of magnetic poles, to obtain absolute positions of the rotating shaft and the galvanometer lens.

17 Claims, 23 Drawing Sheets

GALVANOMETER MOTOR

CROSS-REFERENCE TO RELATED APPLICATION

The present application claims the benefit of priority to China Patent Application No. CN202210605090.1, filed on May 31, 2022, and China Patent Application No. CN202211189663.3, filed on Sep. 28, 2022, the contents of which are hereby incorporated by reference in their entireties.

TECHNICAL FIELD

The present disclosure relates to the technical field of motors, and in particular, to a galvanometer motor and a method for using the same.

BACKGROUND

Galvanometer motors are mainly used in laser devices such as LiDAR, laser marking machines, and laser engraving machines. Under control of a dedicated controller, a rotating shaft of the galvanometer motor drives the galvanometer to swing, so that reflected laser beams reach a specific position accurately.

A stator of the galvanometer motor may be a coil, and the rotor is a magnet. The rotor is located inside the stator. The coil drives the rotor to reciprocate under the action of an alternating drive current. In order to implement precise positioning performance, a dedicated cavity for mounting a feedback sensor such as an encoder is disposed at a tail of the motor. However, with the feedback sensor mounted, the tail of the motor is extended, and as a result, a volume of the galvanometer motor is increased, and the number of components in the galvanometer motor is increased, resulting a complex structure and low yield.

In addition, under terms of vehicle regulations, the galvanometer motor needs to meet a high-precision requirement. Therefore, if an optical encoder with high precision is configured to detect a rotating angle of the rotor, there are problems of high costs, a large volume and contamination tendency. If an ordinary angular position sensor is used, temperature drift is apt to occur due to influence of temperature, which causes offset of an absolute position and further causes inaccuracy of the position of the galvanometer motor, thereby failing to meet the high-precision requirement.

SUMMARY

The present disclosure aims to provide a galvanometer motor, to resolve a technical problem that the galvanometer motor has an excessively large volume.

This application provides a galvanometer motor, including: a stator, where the stator includes a housing and a drive coil mounted inside the housing; a rotor, where the rotor includes a rotating shaft and a galvanometer lens, a pair of radially magnetized magnetic poles are at the middle of the rotating shaft, two ends of the rotating shaft are rotatably mounted inside the housing, and one end of the rotating shaft extends outside the housing and is connected to the galvanometer lens; and a sensor board, where the sensor board is fixed on an inner wall of the housing and is at one end of the housing that is farther away from the galvanometer lens, the sensor board is mounted with a magnetic sensor, and the magnetic sensor is configured to sense a magnetic field signal generated by the pair of magnetic poles, to obtain absolute positions of the rotating shaft and the galvanometer lens.

In an embodiment, the drive coil is wound to form a hollow winding.

In an embodiment, a first restrictive member is mounted on the housing, a second restrictive member is connected to the rotating shaft, and the first restrictive member and the second restrictive member restrict and fit each other, so that the rotating shaft rotates between a first limit position and a second limit position, where a central angle formed by the first limit position, the second limit position and an axis of the rotating shaft is less than 90°.

In an embodiment, an output signal of the magnetic sensor has a sinusoidal function relationship with an angle of the rotating shaft, and an angle of the rotating shaft between the first limit position and the second limit position corresponds to a monotonic interval of the sinusoidal function relationship.

In an embodiment, the first restrictive member is located on an outer wall on one end of the housing that is closer to the galvanometer lens, the number of first restrictive members is two, the two first restrictive members are disposed opposite each other, and second restrictive members are in a one-to-one correspondence with the first restrictive members.

In an embodiment, the first restrictive member comprise two restrictive blocks disposed at one end portion of the housing that is closer to the galvanometer lens, the two restrictive blocks are disposed at intervals, so that the second restrictive member comes into contact with one restrictive block when the rotating shaft rotates to the first limit position, and the second restrictive member comes into contact with the other restrictive block when the rotating shaft rotates to the second limit position.

In an embodiment, the number of the magnetic sensors is more than two, and a phase difference between any two magnetic sensors is greater than 0° and less than 180°.

In an embodiment, the magnetic sensor includes a differential Hall sensor group, the differential Hall sensor group includes two differential Hall sensing units, and a phase difference between the two differential Hall sensing units is 180°.

In an embodiment, the housing includes a housing body and a rear cover, an end of the housing body is open, the rear cover is detachably mounted on the open end of the housing body, the sensor board is fixed on an inner side of the rear cover, and an end of the rotating shaft is rotatably mounted on the rear cover.

In an embodiment, the rear cover has a wire outlet, and a connection terminal of the drive coil and a lead wire of the sensor board are electrically connected to an external drive board through the wire outlet.

In an embodiment, the galvanometer motor further includes two bearings, the bearings are mounted at two ends of the housing and sleeved on the rotating shaft, and the drive coil, the magnetic pole, the sensor board and the magnetic sensor are located between the two bearings.

Effects of the galvanometer motor provided in the present disclosure are as follows: the drive coil is connected to an alternating current to drive the pair of magnetic poles to rotate, that is, the rotating shaft and the galvanometer lens. With the rotation of the pair of magnetic poles, the magnetic field signal generated by the pair of magnetic poles is changed, and the magnetic sensor senses the magnetic field signal to obtain an absolute position of the rotating shaft and further obtain an absolute position of the galvanometer lens connected to the rotating shaft. The pair of radially magnetized magnetic poles are at the middle of the rotating shaft, and compared with multiple pairs of disposed magnets with intersecting and surrounding magnetism, the pair of magnetic poles have fewer components, and not only can rotate in the rotating magnetic field generated by the drive coil, but also can generate the magnetic field signal that can be directly sensed by the magnetic sensor to obtain the absolute position of the rotating shaft, without a need of mounting an additional feedback sensor on the rotating shaft. Correspondingly, a volume of the galvanometer motor is reduced, which resolves the technical problem that the galvanometer motor has the excessively large volume in the related art, thereby reducing difficulty in mounting the galvanometer motor and improving yield of the galvanometer motor.

An embodiment of another aspect of the present disclosure provides a galvanometer motor and a method for using the same, aiming to resolve a technical problem that a position of the galvanometer motor is not accurate enough in the related art.

In an embodiment, this application provides a galvanometer motor, where the galvanometer motor includes: a stator, where the stator includes a housing and a drive coil and a calibration coil mounted inside the housing, and the drive coil is configured to be connected to an alternating current and generate a rotating magnetic field; a rotor, where the rotor includes a rotating shaft and a galvanometer lens, a pair of radially magnetized magnetic poles are at the middle of the rotating shaft, the pair of magnetic poles rotate under action of the rotating magnetic field, two ends of the rotating shaft are rotatably mounted inside the housing, and one end of the rotating shaft extends outside the housing and is connected to the galvanometer lens;

an angular position sensor, where the angular position sensor is fixed on an inner wall of the housing, and the angular position sensor is configured to detect an angular position of the rotor; and the calibration coil, where the calibration coil is mounted on the housing and located on an outer periphery of the pair of magnetic poles, and the calibration coil is configured to sample a back electromotive force generated by the pair of magnetic poles to obtain offset of the angular position sensor when the back electromotive force crosses zero.

In an embodiment, the drive coil and the calibration coil are disposed at intervals along a circumferential direction of the pair of magnetic poles.

In an embodiment, the drive coil is drive windings, the calibration coil is calibration windings, the drive windings are on two opposite sides of an axis of the rotating shaft, and the calibration windings are on other two opposite sides of the axis of the rotating shaft.

In an embodiment, a first central angle formed by the drive winding and the calibration winding relative to the axis of the rotating shaft is 80° to 100°.

In an embodiment, the housing includes a housing body and a rear cover, an end of the housing body is open, the rear cover is detachably mounted on the open end of the housing body, and the angular position sensor is fixed on the rear cover.

In an embodiment, the angular position sensor is a Hall sensor, and the Hall sensor is mounted inside the rear cover.

In an embodiment, the angular position sensor is an encoding disk, the encoding disk includes a reflection portion and a light emission portion, the reflection portion is mounted on an inner surface of the rear cover, the reflection portion includes multiple reflection teeth that are extended in a direction of approaching the rotating shaft and that are spaced apart from each other, the reflection teeth are disposed along a common arc, the arc extends around the axis of the rotating shaft, the light emission portion is mounted on the end of the rotating shaft that is closer to the rear cover, and the light emission portion is configured to emit and receive measurement light; and when the light emission portion rotates along with the rotating shaft relative to the rear cover, the light emission portion obtains the number of reflection teeth scanned by the measurement light, to obtain a rotating angle of the light emission portion relative to the reflection portion.

In an embodiment, the housing is mounted with two first restrictive members distributed at intervals, a second central angle formed by the two first restrictive members relative to the axis of the rotating shaft is 10° to 80°, the rotating shaft is connected to a second restrictive member, and the second restrictive member is located between the two first restrictive members.

In an embodiment, when a back electromotive force crosses zero, the second restrictive member is located on an angle bisector of the second central angle.

According to a second aspect, this application provides a method for using a galvanometer motor, where the method includes the following steps:

S100. Connect a drive coil to an alternating current to generate a rotating magnetic field, to drive a rotor including a pair of magnetic poles to rotate.

S200. Detect an angular position of the rotor via an angular position sensor.

S300. When the back electromotive force that is sampled by a calibration coil and that is generated by the pair of magnetic poles crosses zero, make comparison to obtain offset between an actual angular position of the rotor and an angular position detected by the angular position sensor, to calibrate offset of the angular position sensor.

In an embodiment, the rotor reciprocates between a first limit angle and a second limit angle, one reciprocating rotation of the rotor is one cycle, and when the rotor rotates from the second limit angle to the first limit angle, step S300 is performed, and the offset of the angular position sensor is calibrated before the next cycle.

In an embodiment, a corresponding angular position when the back electromotive force that is sampled by a calibration coil and that is generated by the pair of magnetic poles crosses zero is defined as a starting angle, and an average of the first limit angle and the second limit angle is the starting angle.

Effects of the galvanometer motor and the method for using the galvanometer motor provided in the present disclosure are as follows: The drive coil is connected to the alternating current and generates the rotating magnetic field, the pair of magnetic poles drive the entire rotor in the rotating magnetic field to rotate, and the galvanometer motor measures the angular position of the rotor via the angular position sensor, to control the rotating angle of the galvanometer lens. In addition, a corresponding actual angular position and the angular position measured by the angular position sensor when the back electromotive force sampled by the calibration coil crosses zero are compared, to obtain the offset there between, which can calibrate the offset of the angular position sensor and continuously calibrate the angular position sensor during operation, thereby resolving the technical problem that the position of the galvanometer motor is not accurate enough in the related art and improving control accuracy of the galvanometer motor.

BRIEF DESCRIPTION OF DRAWINGS

To explain the technical solution in embodiments in the present disclosure, the following briefly introduces the accompanying drawings. Obviously, the accompanying drawings in the following description are only some embodiments in the present disclosure.

Reference signs in FIG. 1 to FIG. 10:

- 100—stator; 110—housing; 111—first restrictive member; 112—restrictive block; 113—restrictive groove; 114—connecting wall; 115—housing body; 116—rear cover; 117—wire outlet; 120—drive coil; 121—connection terminal;
- 200—rotor; 210—rotating shaft; 211—magnetic pole; 212—second restrictive member; 220—galvanometer lens;
- 300—sensor board; 310—magnetic sensor; 311—differential Hall sensor group; 312—differential Hall sensing unit; 320—lead wire; and
- 400—bearing.

Figure 11:
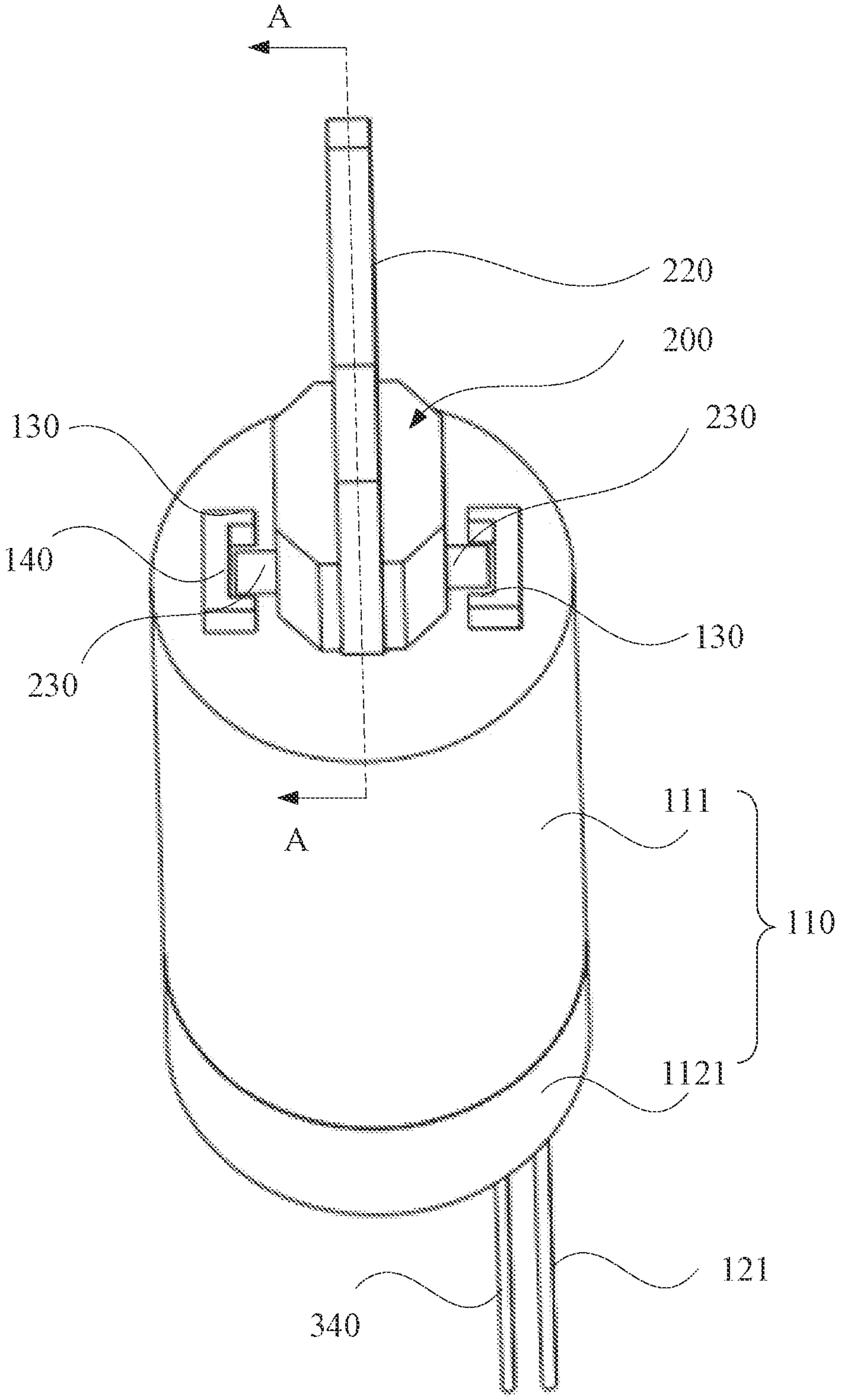
Figure 12:
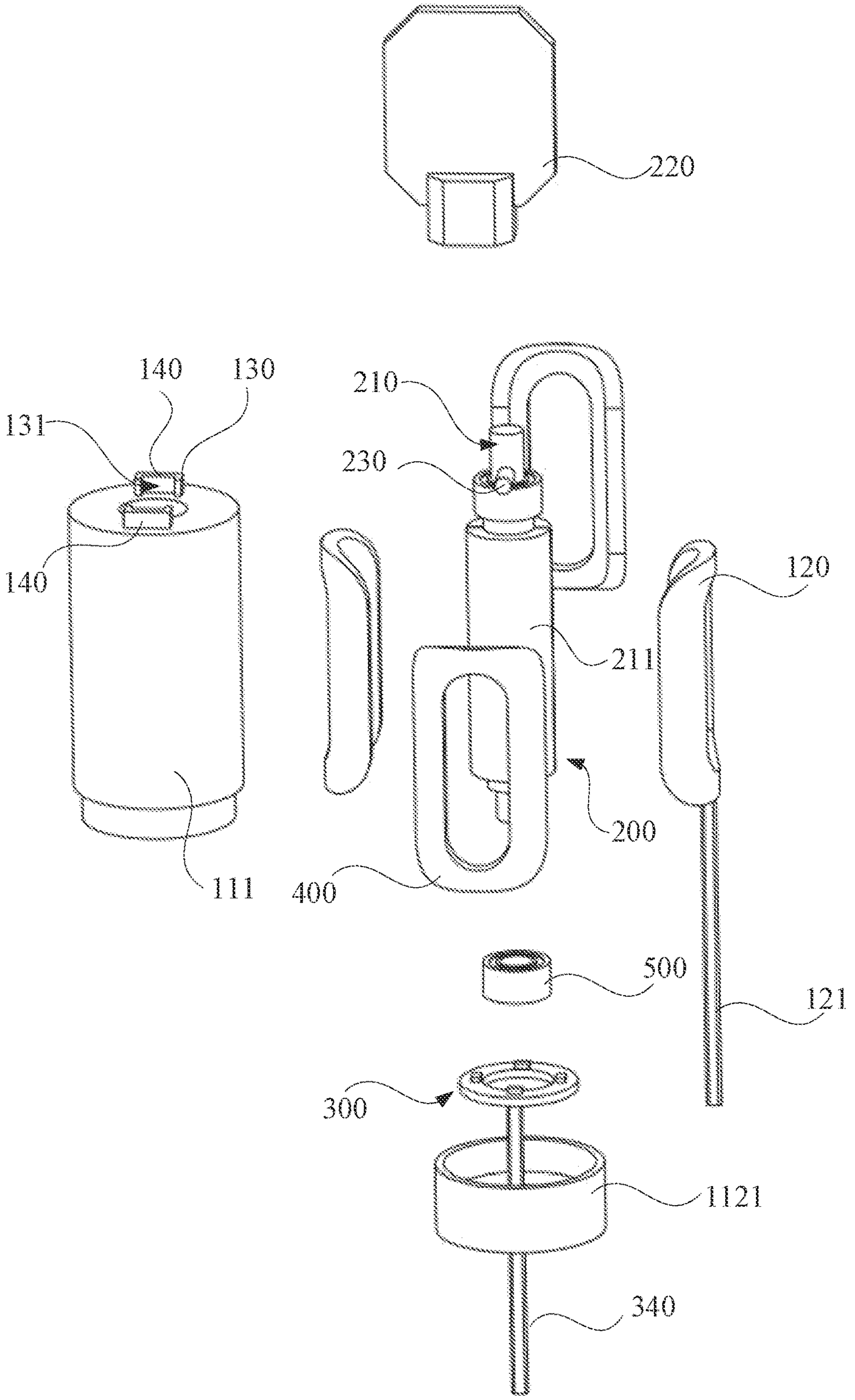
Figure 13:
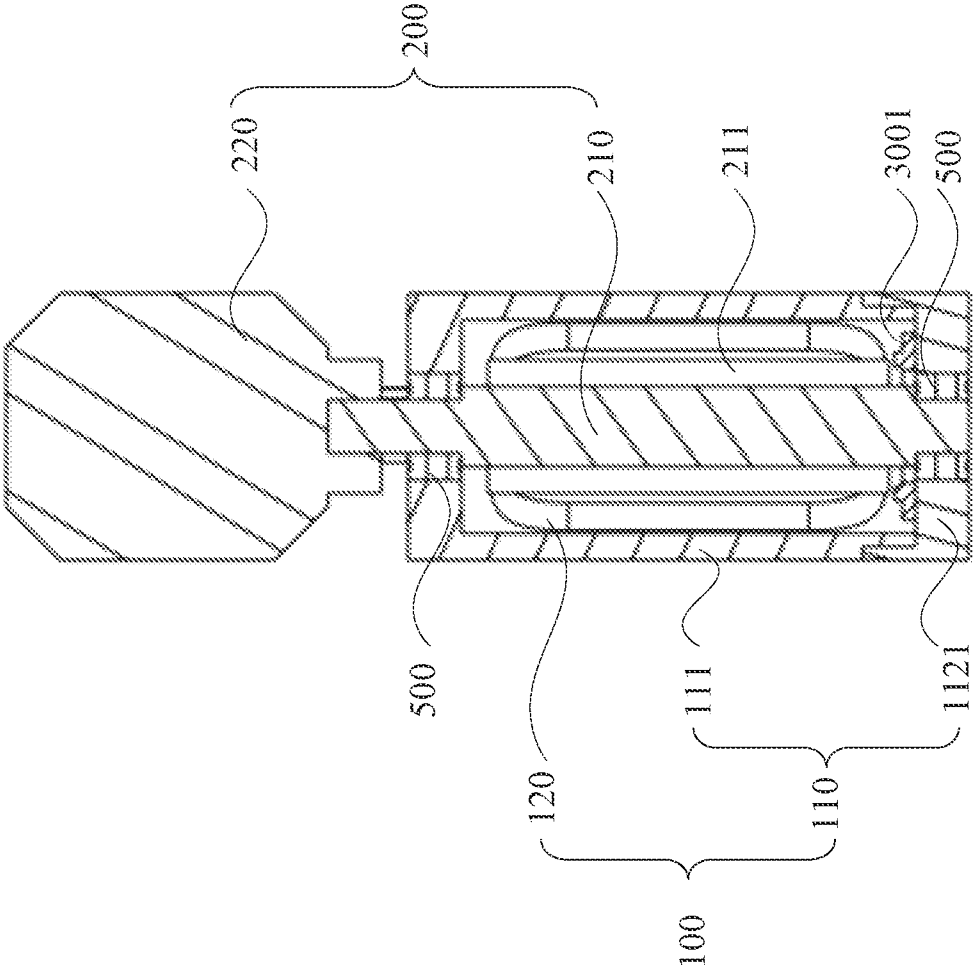
Figure 14:
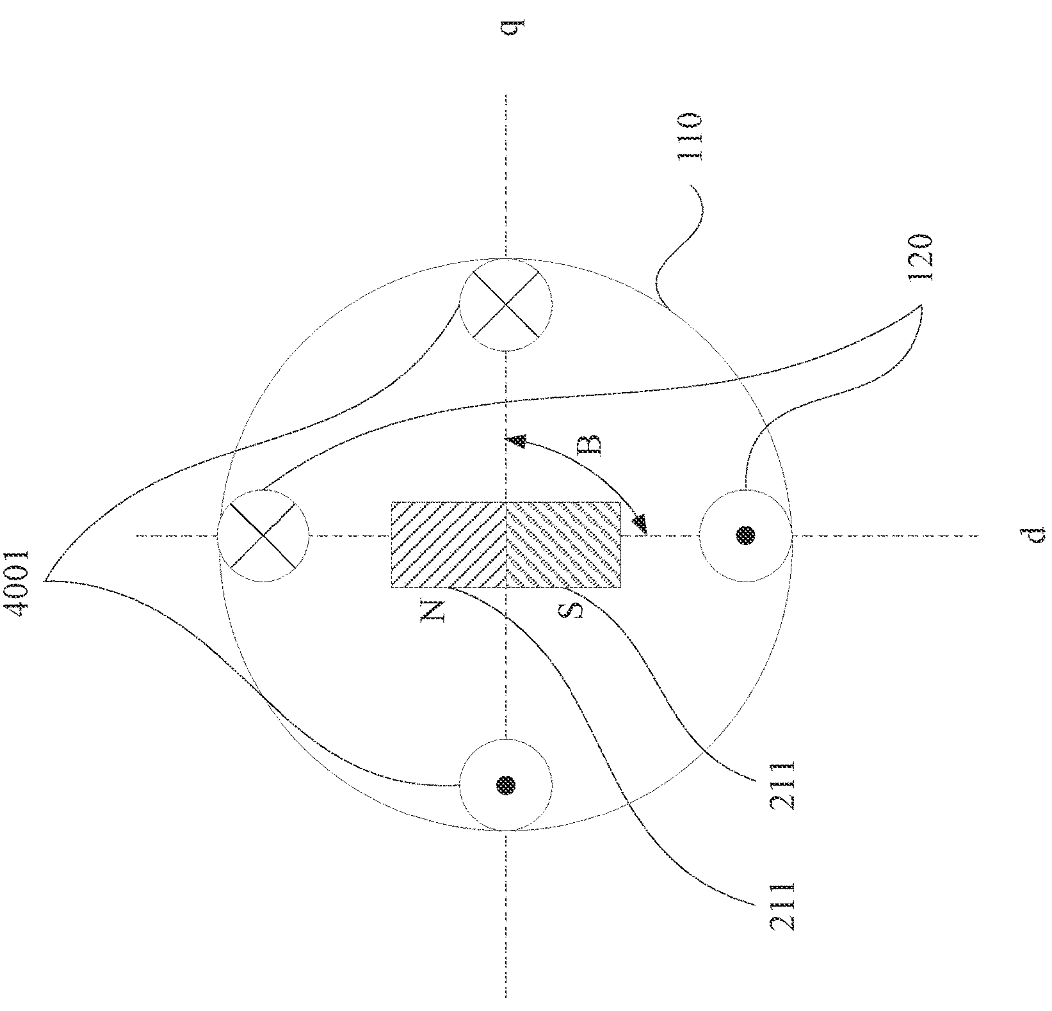
Figure 15:
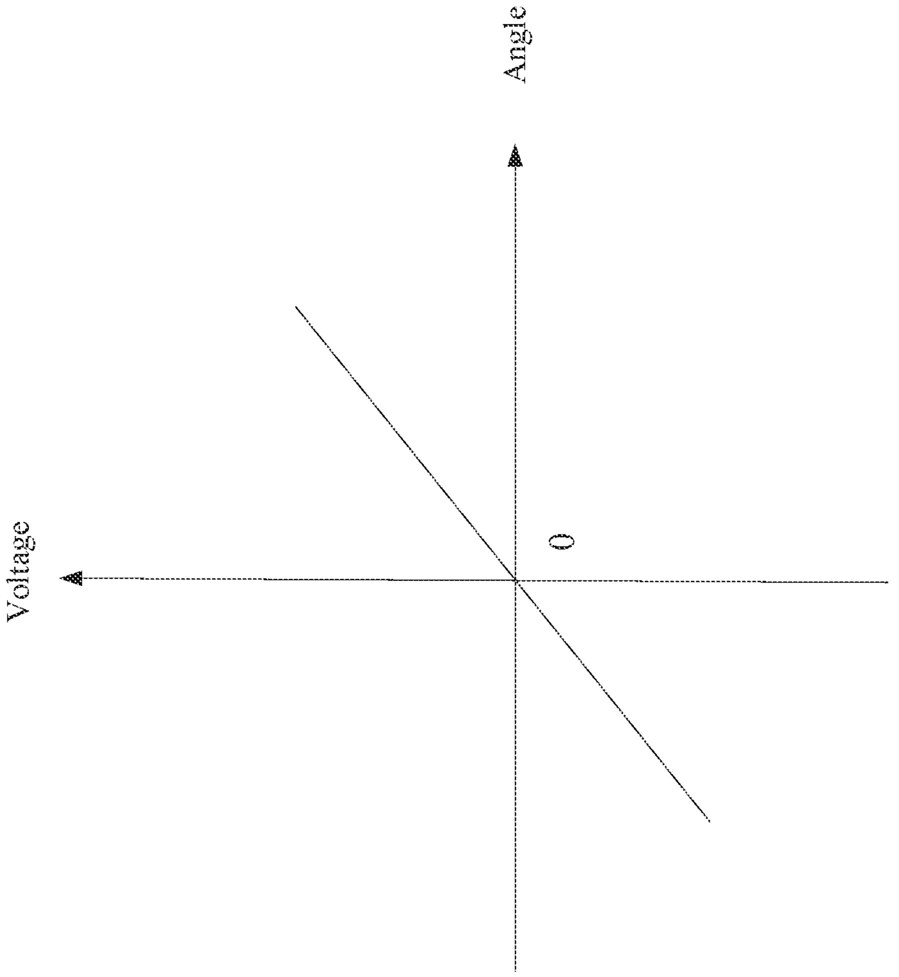
Figure 16:
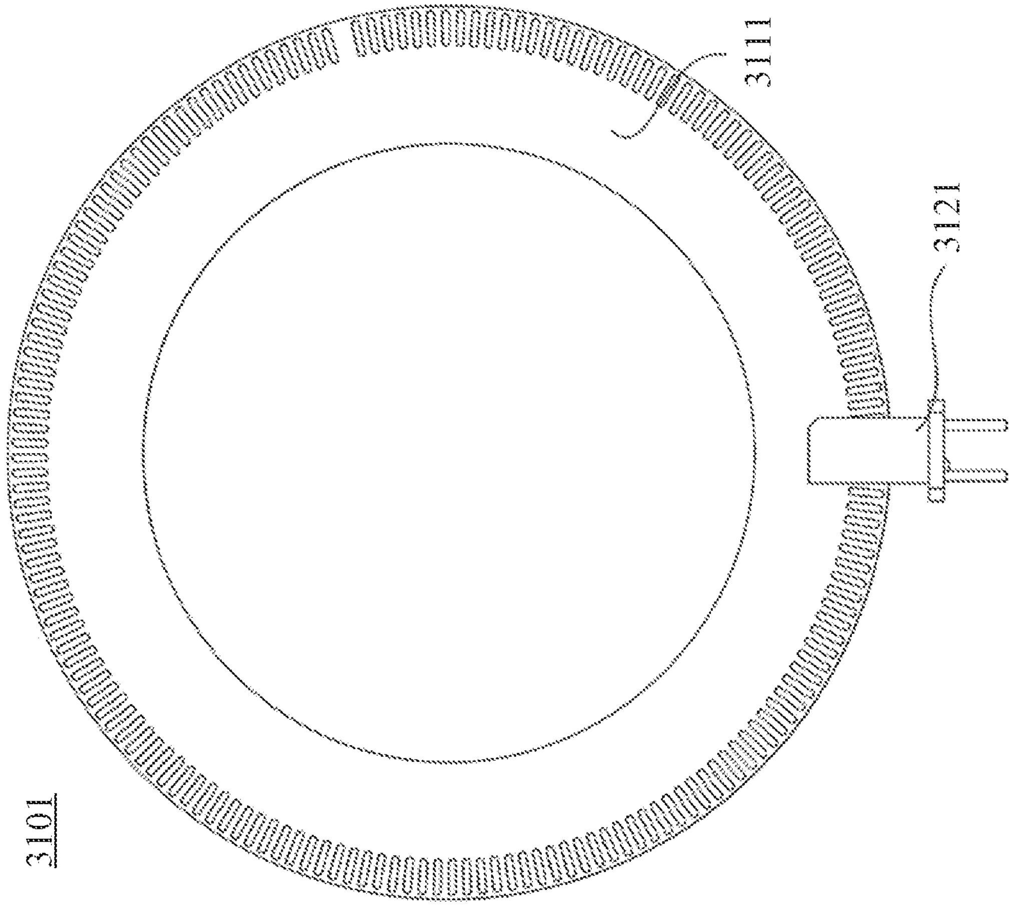
Figure 17:
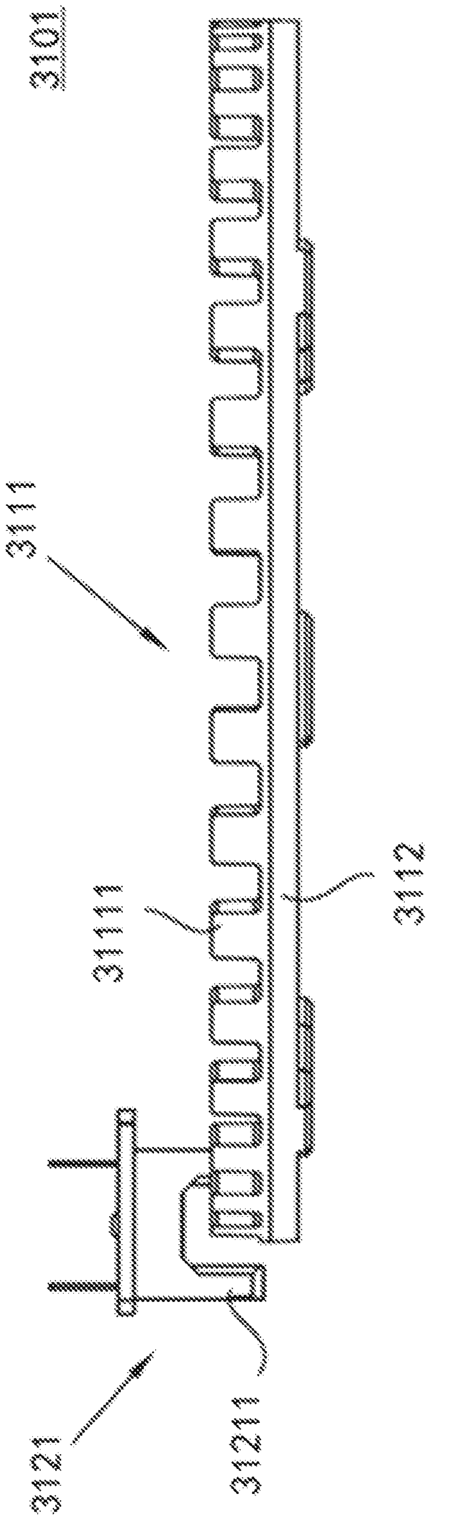
Figure 18:
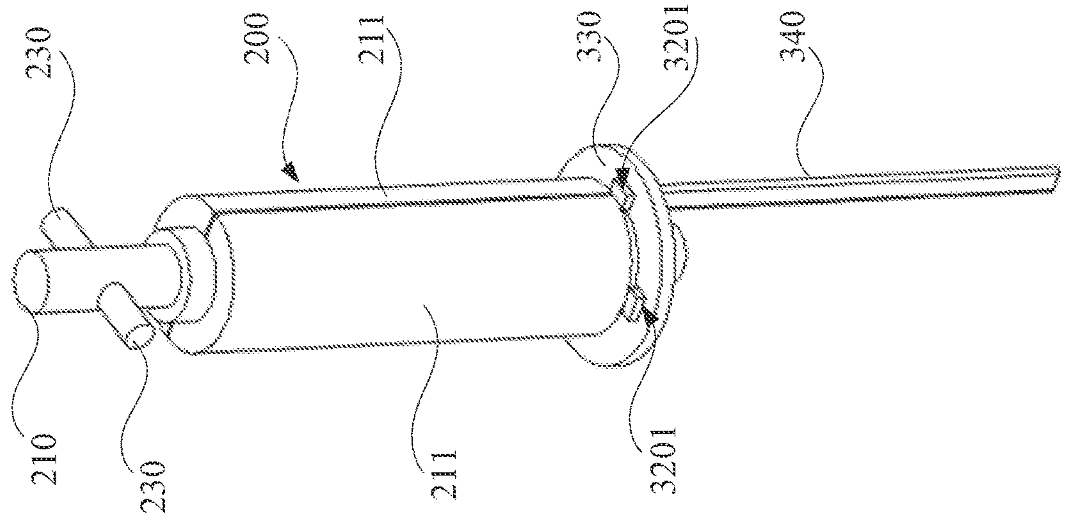
Figure 19:
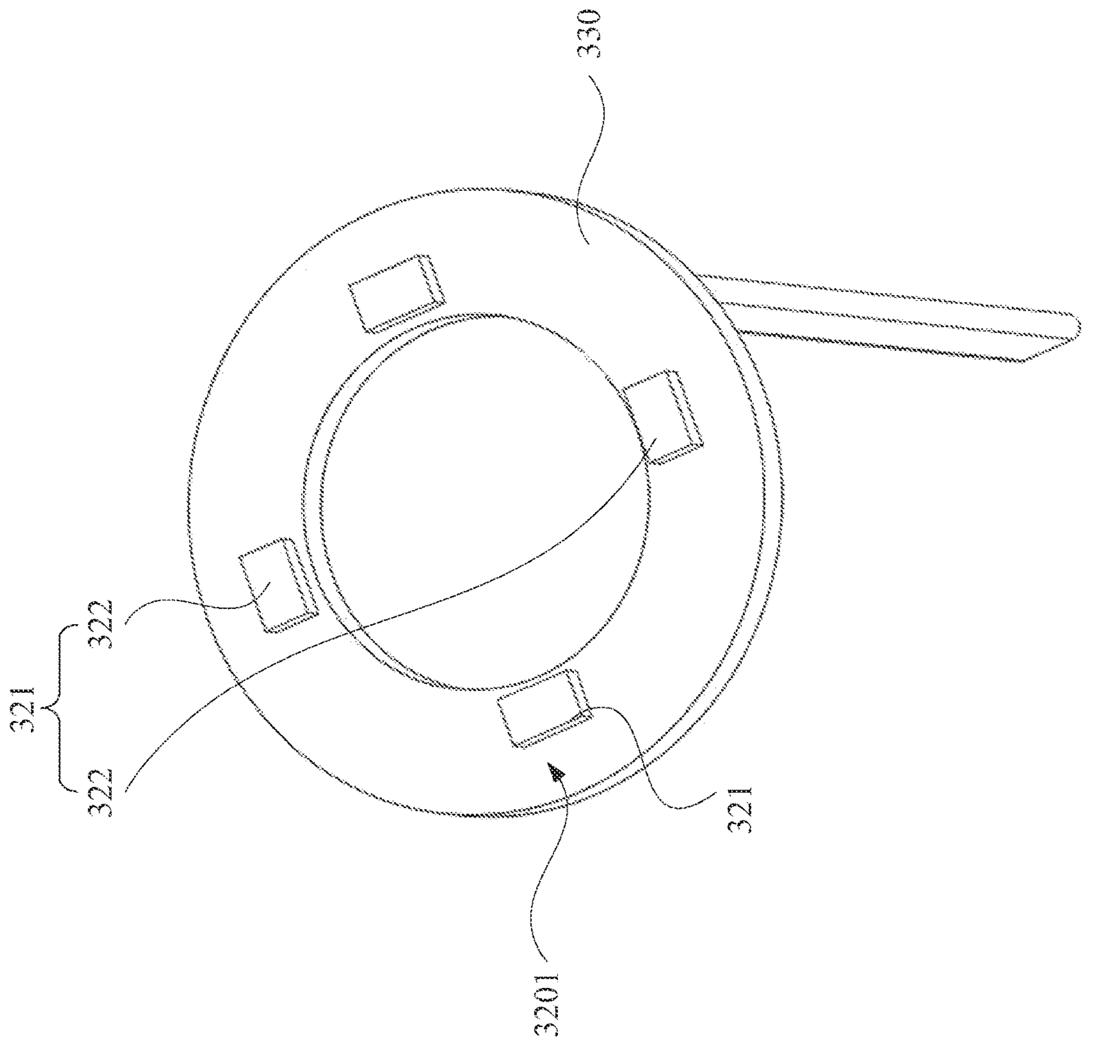
Figure 20:
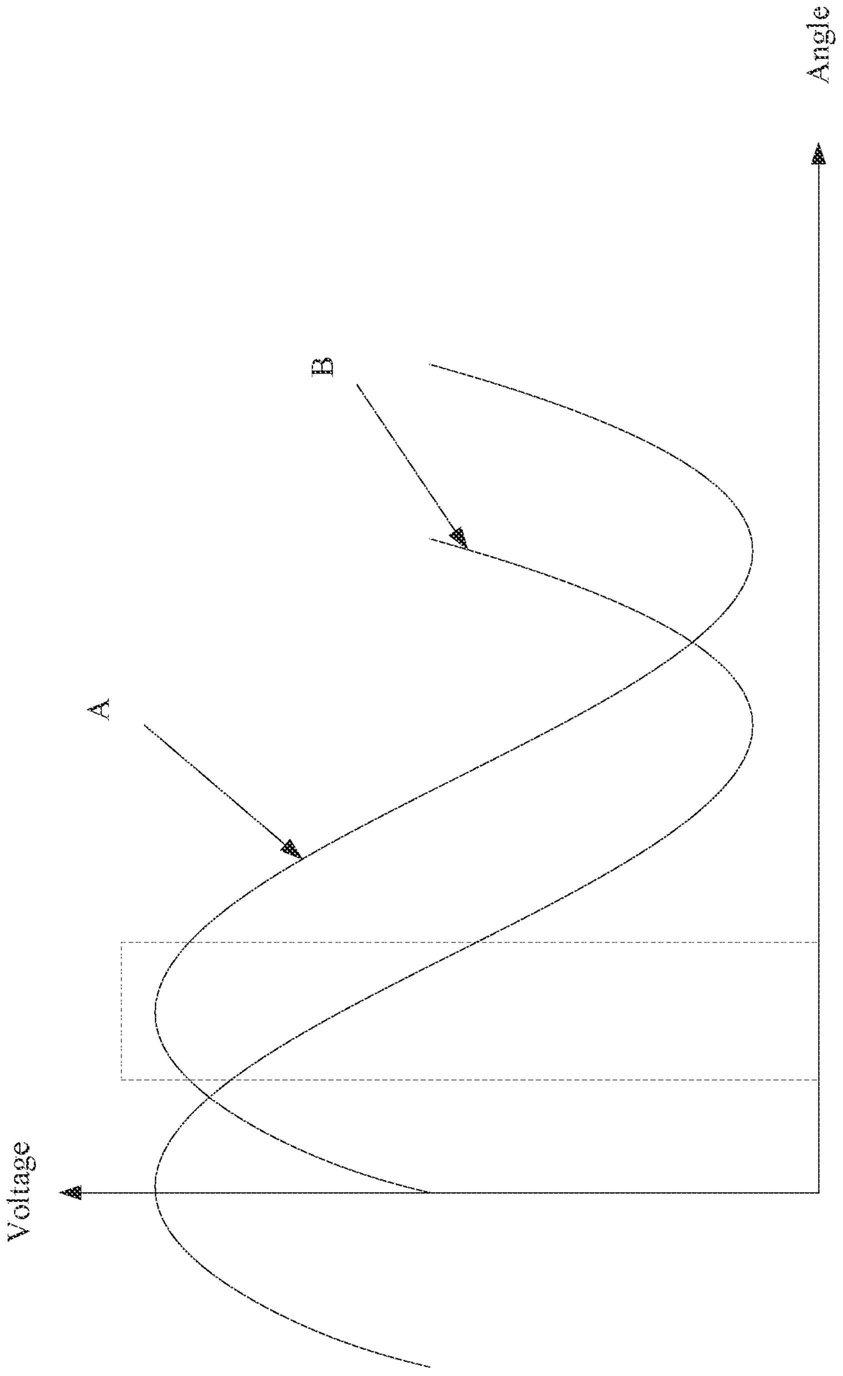
Figure 21:
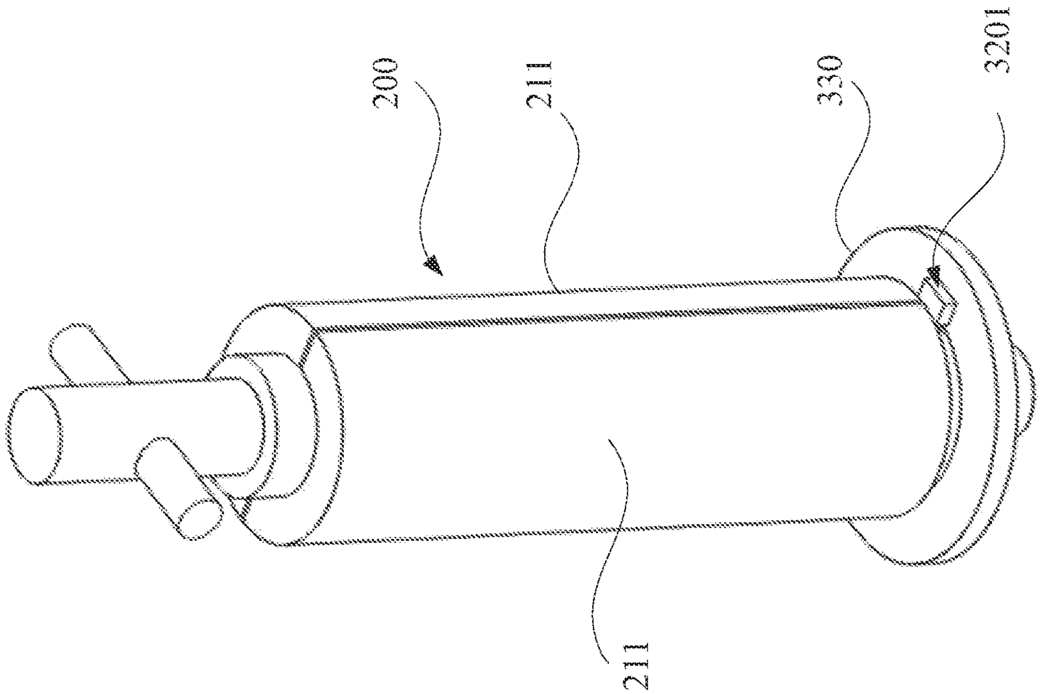
Figure 22:
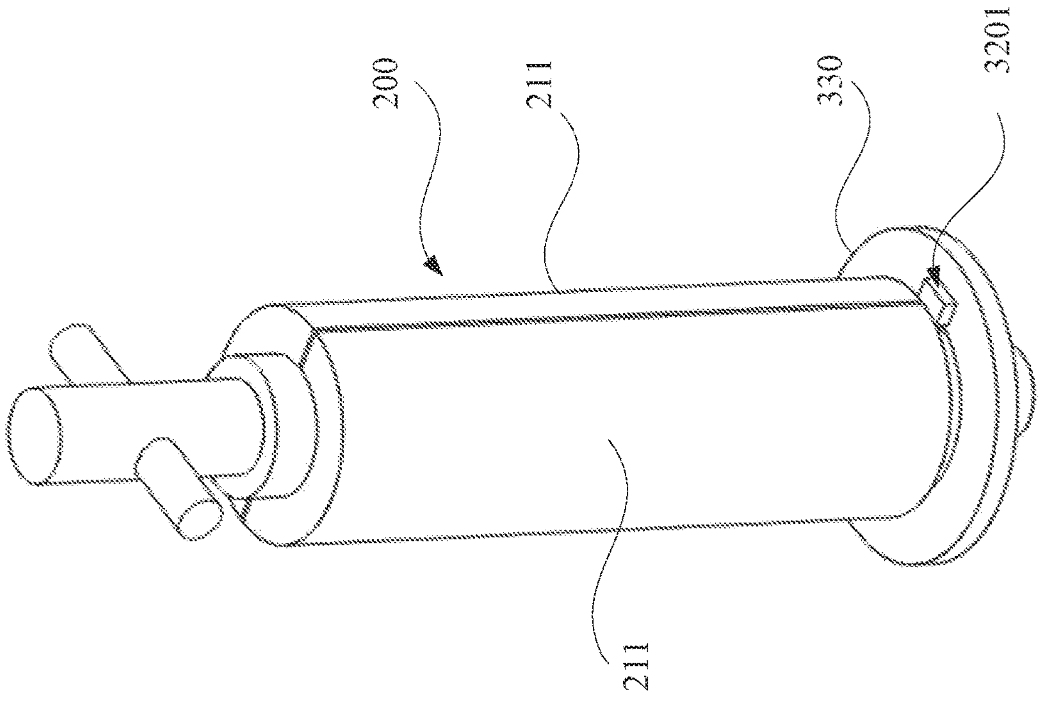
Figure 23:
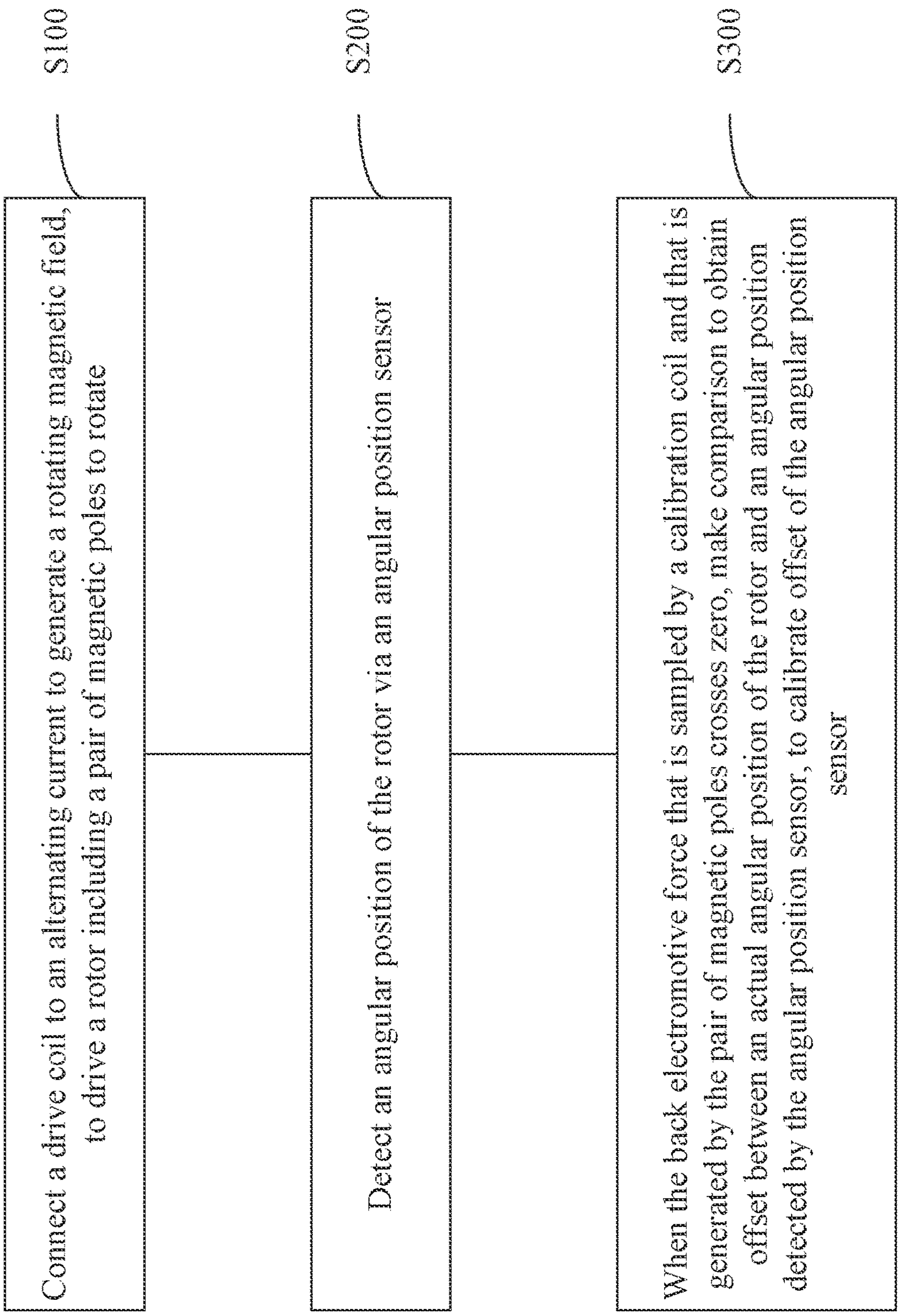

FIG. 11 is a schematic structural diagram of a galvanometer motor according to an embodiment of the present disclosure;

FIG. 12 is an exploded view of the galvanometer motor in FIG. 11;

FIG. 13 is a cross-sectional view of the galvanometer motor in FIG. 11 along a line A-A;

FIG. 14 is a schematic diagram of a position relationship between a housing, a drive coil, a calibration coil and a magnetic pole;

FIG. 15 is a curve chart of a back electromotive force sampled by a calibration coil;

FIG. 16 is a schematic structural diagram of a first angular position sensor according to an embodiment;

FIG. 17 is another structural view of the angular position sensor in FIG. 16;

FIG. 18 is a schematic diagram of mounting of a rotating shaft of a galvanometer motor and a second angular position sensor according to an embodiment;

FIG. 19 is a schematic structural diagram of the second angular position sensor in FIG. 18;

FIG. 20 is a curve chart of an output signal of the second sensor in FIG. 19;

FIG. 21 is a schematic diagram of mounting of a rotating shaft of a galvanometer motor and a third angular position sensor according to an embodiment;

FIG. 22 is a schematic diagram of mounting of a rotating shaft of a galvanometer motor and a fourth angular position sensor according to an embodiment; and FIG. 23 is a schematic flowchart of a method for using a galvanometer motor according to an embodiment.

Reference signs in FIG. 11 to FIG. 23:

- 100—stator; 110—housing; 111—housing body; 1121—rear cover; 1131—wire outlet; 120—drive coil; 121—connection terminal; 130—first restrictive member; 131 restrictive groove; 140—connection arm;
- 200—rotor; 210—rotating shaft; 211—magnetic pole; 220—galvanometer lens; 230—second restrictive member; and
- 3001—angular position sensor; 3101—encoding disk; 3111—reflection portion; 31111—reflection teeth; 3112—connection member; 3121—light emission portion; 31211—first working body; 3122—second working body; 3201—Hall sensor; 321 differential Hall sensor group; 322—differential Hall sensing unit; 330—circuit board; 340—lead wire; 4001—calibration coil; 500—bearing.

DETAILED DESCRIPTION

The embodiments of the present disclosure are described in detail below. Examples of the embodiments are shown in the accompanying drawings, and the same or similar reference signs indicate the same or similar elements or elements with the same or similar functions. The embodiments described below with reference to the drawings are exemplary and intended to explain the present disclosure, but cannot be construed as a limitation on the present disclosure.

Referring to "an embodiment" or "embodiments" throughout this specification means that a specific feature, structure, or characteristic described with reference to the embodiment is included in at least one embodiment of this application. Therefore, the phrase "in an embodiment" or "in some embodiments" appearing throughout the specification does not always refer to a same embodiment. In addition, a specific feature, structure, or characteristic may be combined in any appropriate manner in one or more embodiments.

In the description of the present disclosure, it should be understood that azimuth or position relationships indicated by terms such as "length," "width," "above," "under," "front," "rear," "left," "right," "vertical," "horizontal," "top," "bottom," "inner," and "outer" are based on the azimuth or position relationships shown in the accompanying drawings, are merely intended to describe the present disclosure and simplify the descriptions, but are not intended to indicate or imply that the specified device or element shall have specific azimuth or be formed and operated in specific azimuth, and therefore cannot be understood as a limitation on the present disclosure.

In addition, the terms such as "first" and "second" are merely intended for the purpose of description, and shall not be understood as an indication or implication of relative importance or implicit indication of a quantity of indicated technical features. Therefore, a feature with a determiner such as "first" or "second" may expressly or implicitly include one or more features.

In the present disclosure, unless otherwise clearly specified and limited, terms such as "mounting," "connection," "link," and "fixing" should be understood in a general sense. For example, these terms may be a fixed connection, a detachable connection, or an integrated connection; or may be a mechanical connection or an electrical connection; or may be a direct connection, an indirect connection via an intermediate medium, or an internal link of two elements or an interaction of two elements. A person of ordinary skill in the art may understand specific meanings of the foregoing terms in the present disclosure according to a specific situation.

The galvanometer motor in the embodiments of the present disclosure is described.

Figure 1:
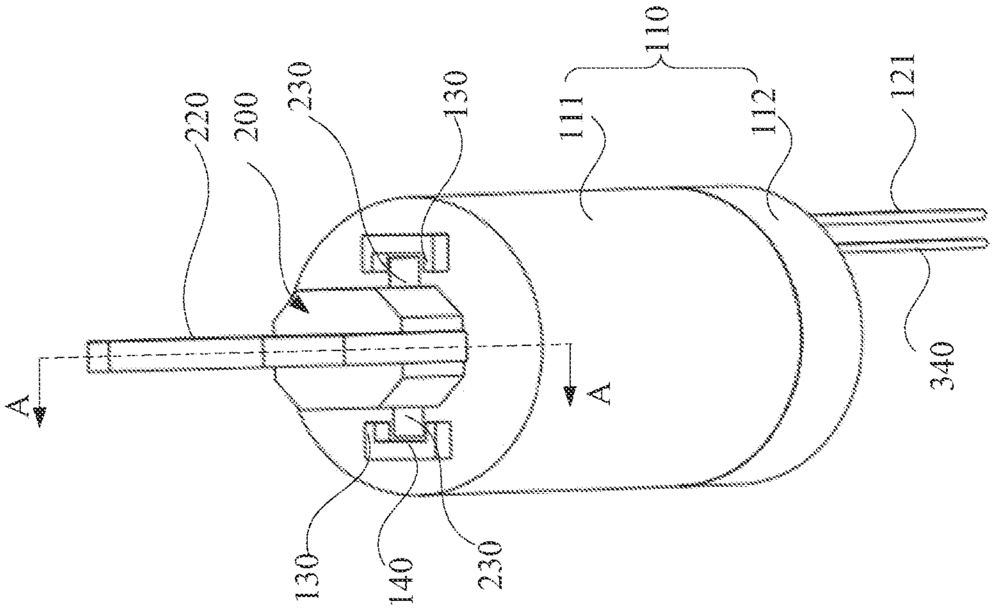
FIG. 1 is a schematic structural diagram of a galvanometer motor according to an embodiment of the present disclosure.
Figure 2:
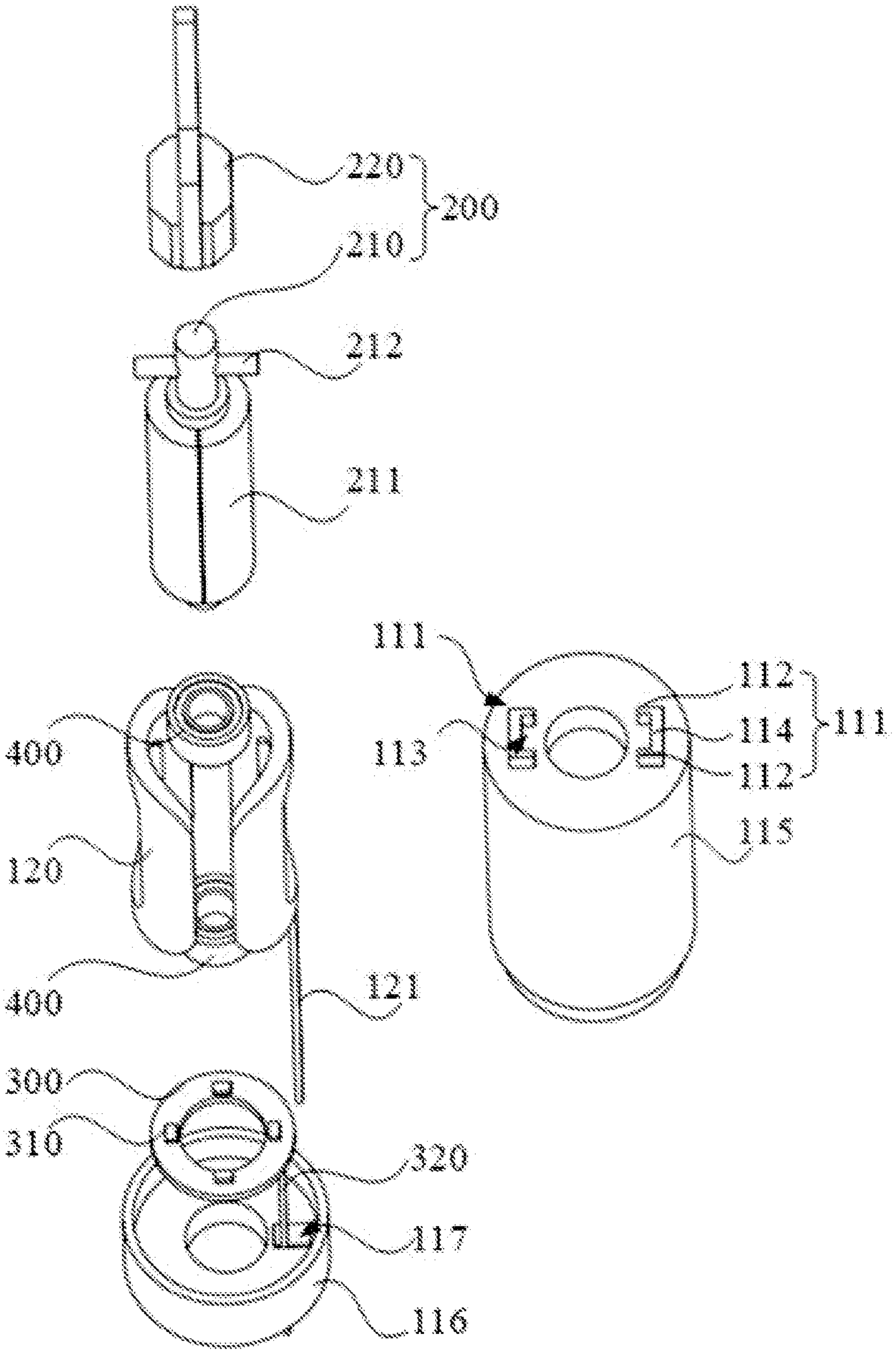
FIG. 2 is an exploded view of the galvanometer motor in FIG. 1.
Figure 3:
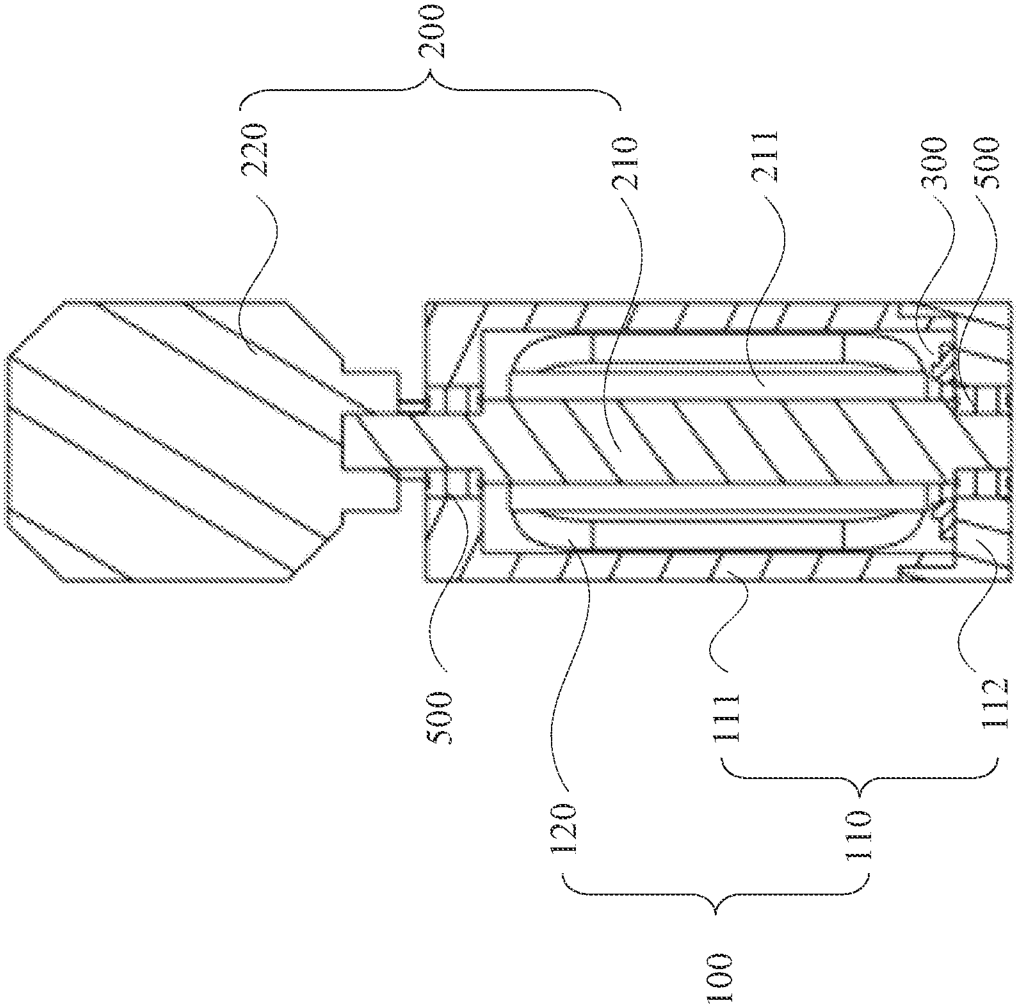
FIG. 3 is a cross-sectional view of the galvanometer motor in FIG. 1 along a line A-A.
Figure 4:
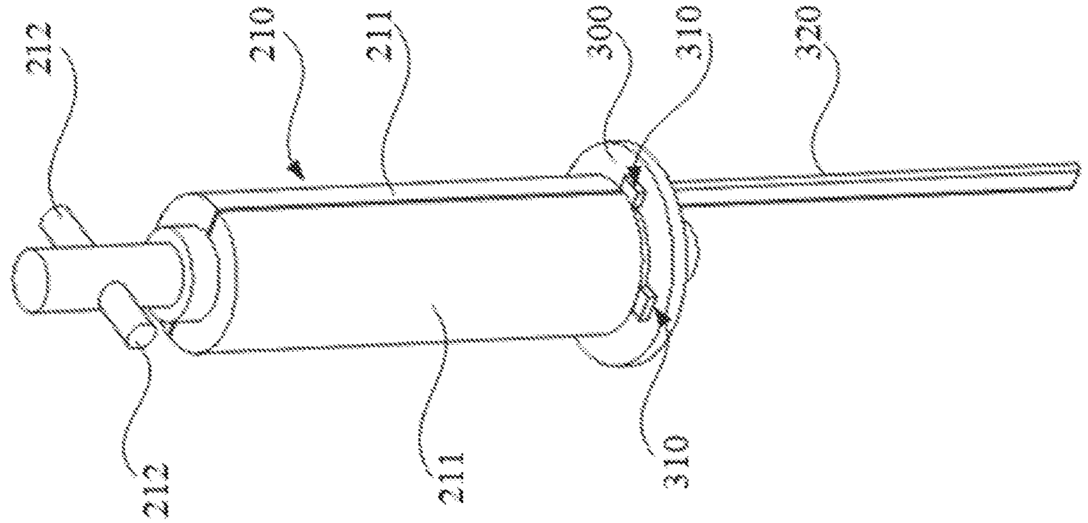
FIG. 4 is a schematic diagram of mounting of a rotating shaft of a galvanometer motor and a sensor board according to an embodiment.

Referring to FIG. 1 to FIG. 3, the galvanometer motor provided in this embodiment includes a stator 100, a rotor 200, and a sensor board 300.

The stator 100 includes a housing 110 and a drive coil 120 mounted in the housing 110. Herein, in some embodiments, the number of connection terminals 121 of the drive coil 120 is two. The rotor 200 includes a rotating shaft 210 and a galvanometer lens 220, a pair of radially magnetized magnetic poles 211 are at the middle of the rotating shaft 210, two ends of the rotating shaft 210 are rotatably mounted inside the housing 110, and one end of the rotating shaft 210 extends outside the housing 110 and is connected to the galvanometer lens 220. There is a gap between the stator 100 and the rotor 200. The sensor board 300 is fixed on an inner wall of the housing 110 and is at one end of the housing 110 that is farther away from the galvanometer lens 220, the sensor board 300 is mounted with a magnetic sensor 310, and the magnetic sensor 310 is configured to sense a magnetic field signal generated by the pair of magnetic poles 211, to obtain absolute positions of the rotating shaft 210 and the galvanometer lens 220.

In some embodiments of this application, the drive coil 120 has only two connection terminals 121 connected to the alternating current, only the alternating current needs to be input as a control signal in one direction, the drive coil 120 generates a rotating magnetic field to drive the pair of magnetic poles 211 to rotate, that is, the rotating shaft 210 and the galvanometer lens 220. With the rotation of the pair of magnetic poles 211, the magnetic field signal generated by the pair of magnetic poles 211 is changed, and the magnetic sensor 310 senses the magnetic field signal to obtain an absolute position of the rotating shaft 210 and further obtain an absolute position of the galvanometer lens 220 connected to the rotating shaft 210. The pair of radially magnetized magnetic poles 211 are at the middle of the rotating shaft 210, and compared with multiple pairs of disposed magnets with intersecting and surrounding magnetism, the pair of magnetic poles 211 have fewer components, and not only can rotate in the rotating magnetic field generated by the drive coil 120, but also can generate the magnetic field signal that can be directly sensed by the magnetic sensor 310 to obtain the absolute position of the rotating shaft 210, without a need of mounting an additional feedback sensor on the rotating shaft 210, which implements a compact structure, thereby facilitating a reduction in difficulty in mounting the galvanometer motor, reducing a volume of the galvanometer motor, and improving yield of the galvanometer motor.

In another embodiment of this application, the drive coil 120 is wound to form a hollow winding. The drive coil 120 has no iron core inside, and has characteristics of small inductance and a small back electromotive force, thereby changing the control signal more quickly and improving the response speed.

In another embodiment of this application, referring to FIG. 2, a first restrictive member 111 is mounted on the housing 110, a second restrictive member 212 is connected to the rotating shaft 210, and the first restrictive member 111 and the second restrictive member 212 restrict and fit each other, so that the rotating shaft 210 rotates between a first limit position and a second limit position, where a central angle formed by the first limit position, the second limit position, and an axis of the rotating shaft 210 is less than 90°. An angle by which the rotating shaft 210 rotates around an axis of the rotating shaft 210 from the first limit position to the second limit position is the central angle.

In an example, the galvanometer motor limits the rotating angle of the galvanometer lens 220 within 90°, which helps quickly determine a rotating angle of the rotating shaft 210 relative to an initial position within a limited rotating angle based on an output signal of the magnetic sensor 310, thereby determining absolute positions of the rotating shaft 210 and the galvanometer lens 220.

In some embodiments, the central angle formed by the first limit position, the second limit position, and the axis of the rotating shaft 210 is 5°, 10°, 20°, 30°, 45° or 60°.

Figure 6:
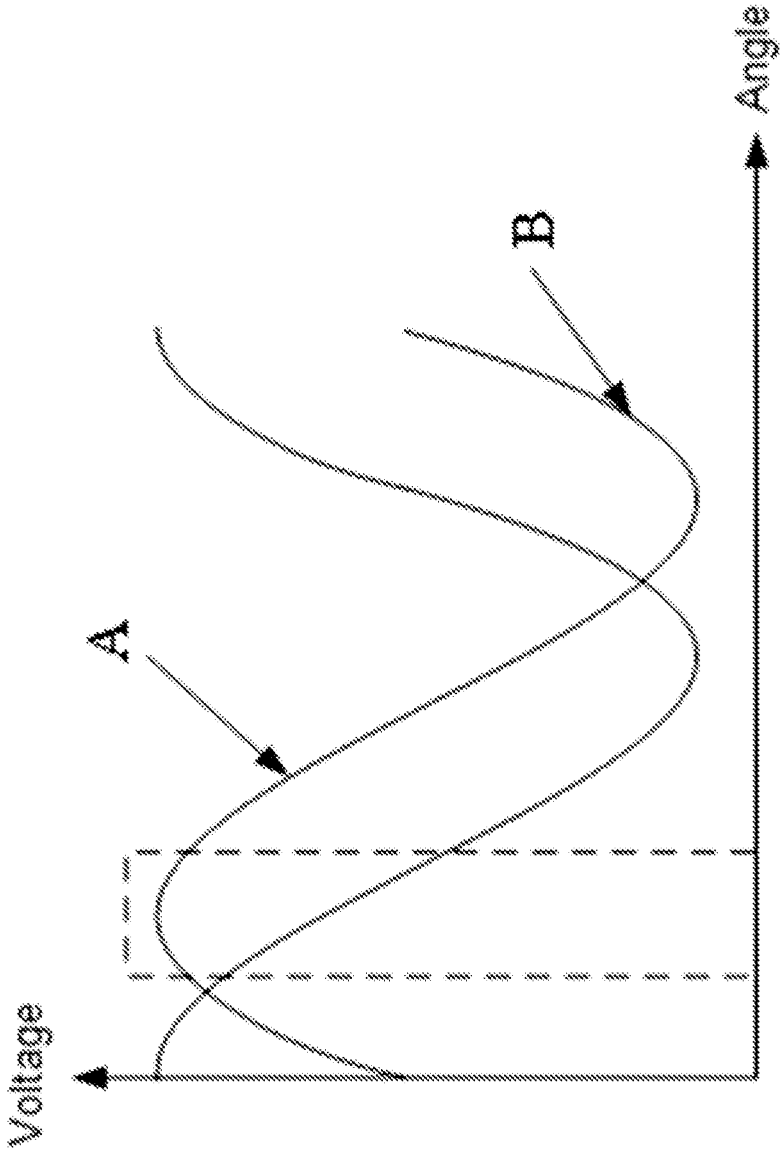
FIG. 6 is a curve chart of an output signal of a magnetic sensor of the galvanometer motor according to an embodiment.

Referring to FIG. 3 and FIG. 6, the output signal of the magnetic sensor 310 has a sinusoidal function relationship with an angle of the rotating shaft 210, and the magnetic sensor 310 generates one complete sine wave when the rotating shaft 210 rotates by one turn. The sinusoidal function relationship in this application indicates that the output signal y of the magnetic sensor 310 and the angle x of the rotating shaft 210 satisfy the sinusoidal function analytical formula $y=A \sin(\omega x+\varphi)+h$, where parameters A, ω, and φ are determined based on specific scenarios.

In some embodiments, the angle of the rotating shaft 210 between the first limit position and the second limit position corresponds to a monotonic interval of the sinusoidal function relationship, and output signals y of the magnetic sensor 310 are in a one-to-one correspondence with angles x of the rotating shaft 210, so that the unique angle x of the rotating shaft 210 is obtained based on the output signals y of the magnetic sensor 310. For example, referring to FIG. 6, a dotted box is within a monotonic interval of a curve B other than a monotonic interval of a curve A.

Herein, the output signal of the magnetic sensor 310 is usually a voltage.

In an example, the position relationship between the magnetic sensor 310 and the magnetic pole 211 is limited, to ensure that the angle of the rotating shaft 210 between the first limit position and the second limit position corresponds to the monotonic interval of the sinusoidal function relationship.

Figure 7:
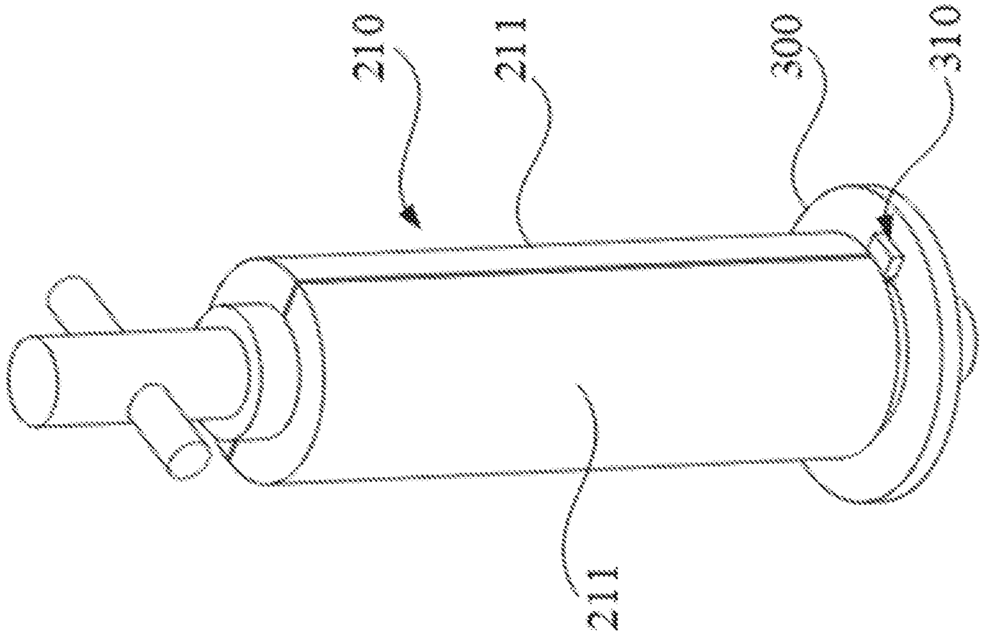
FIG. 7 is a schematic diagram of mounting of a rotating shaft of a galvanometer motor and a sensor board according to another embodiment.
Figure 8:
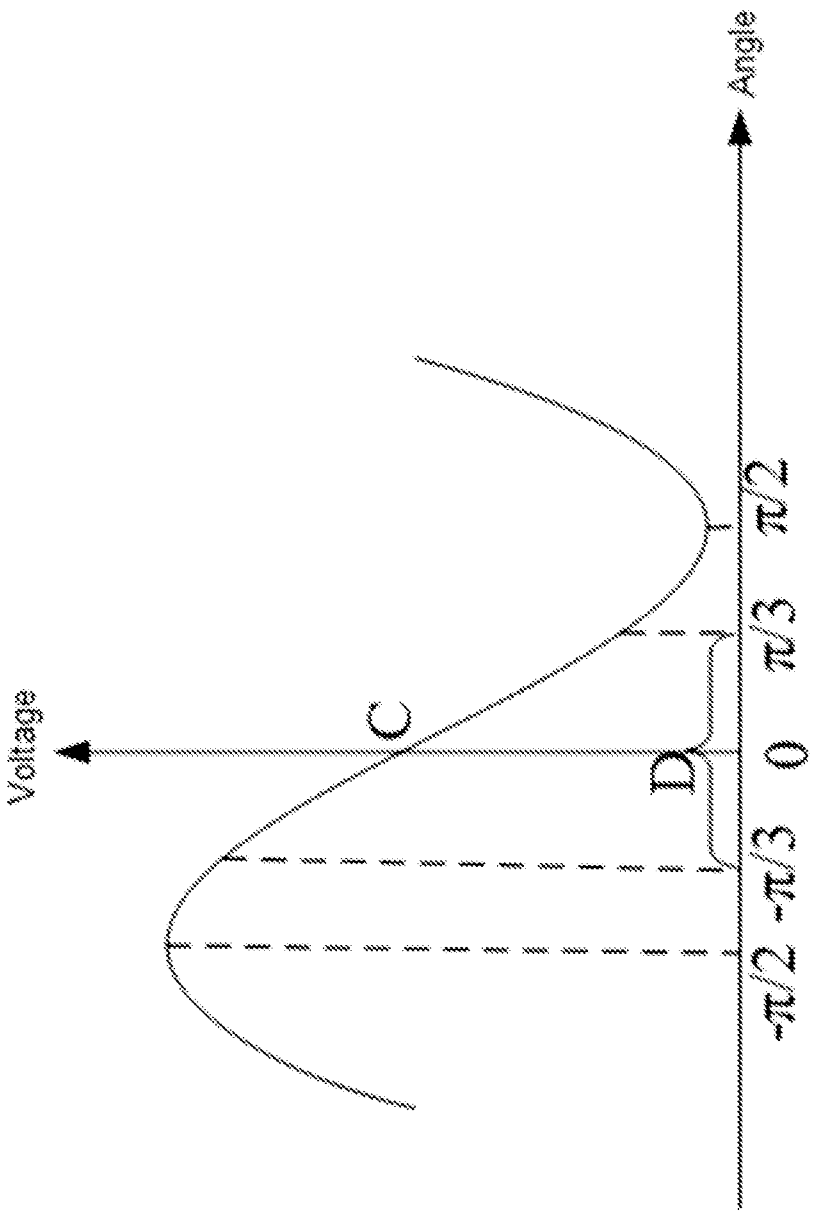
FIG. 8 is a curve chart of an output signal of a magnetic sensor of the galvanometer motor in FIG. 7.

In some embodiments, referring to FIG. 7, when the rotating shaft 210 is at the initial position, the magnetic sensor 310 is mounted on the sensor board 300, and interfaces of the magnetic sensor 310 and the pair of magnetic poles 211 are in the same radial direction of the rotating shaft 210. The rotating angle of the rotating shaft 210 is 0 degrees, and interfaces of the magnetic sensor 310 and the pair of magnetic poles 211 are disposed opposite each other. As shown in FIG. 8, because magnetic field intensity at the interface of the pair of magnetic poles 211 is the minimum, at this time, the output signal of the magnetic sensor 310 is an average value of the sine wave (refer to a point C in FIG. 8), and the rotating shaft 210 rotates within ±45°, which is within the monotonic interval of the sinusoidal function relationship, so that the output signals of the magnetic sensor 310 are in a one-to-one correspondence with the angles of the rotating shaft 210. In this way, during manufacture, the relative position relationship between the magnetic sensor 310 and the pair of magnetic poles 211 at initial positions is limited, so that the angle of the rotating shaft 210 between the first limit position and the second limit position corresponds to the monotonic interval of the sinusoidal function relationship.

As the rotating angle of the rotating shaft 210 is less than 90°, in another example, provided that the angle of the rotating shaft 210 falls within the monotonic interval of the sinusoidal function relationship when rotating within the rotating angle range, when the rotating shaft 210 is at the initial position, the interfaces of the magnetic sensor 310 and the pair of magnetic poles 211 are not necessarily in the same radial direction of the rotating shaft 210. For example, the rotating angle of the rotating shaft 210 is $\pm\pi/6$. When the rotating angle of the rotating shaft 210 is 0 degrees, the central angle formed between the interfaces of the magnetic sensor 310 and the pair of magnetic poles 211 does not exceed $\pm\pi/3$. Referring to FIG. 8, when the rotating shaft 210 is at the initial position, an abscissa is within an interval D, and the interval D moves leftward and rightward by $\pi/6$, which still corresponds to the monotonic interval of the sinusoidal function relationship. That is, the output signals of the magnetic sensor 310 are in a one-to-one correspondence with the angles of the rotating shaft 210.

Figure 9:
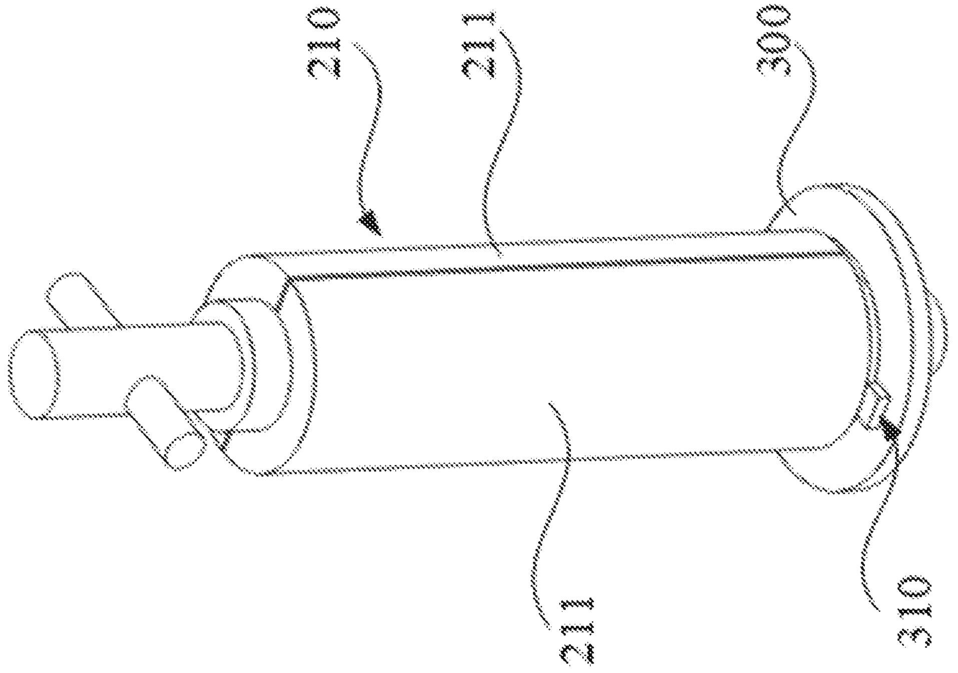
FIG. 9 is a schematic diagram of mounting of a rotating shaft of a galvanometer motor and a sensor board according to another embodiment.
Figure 10:
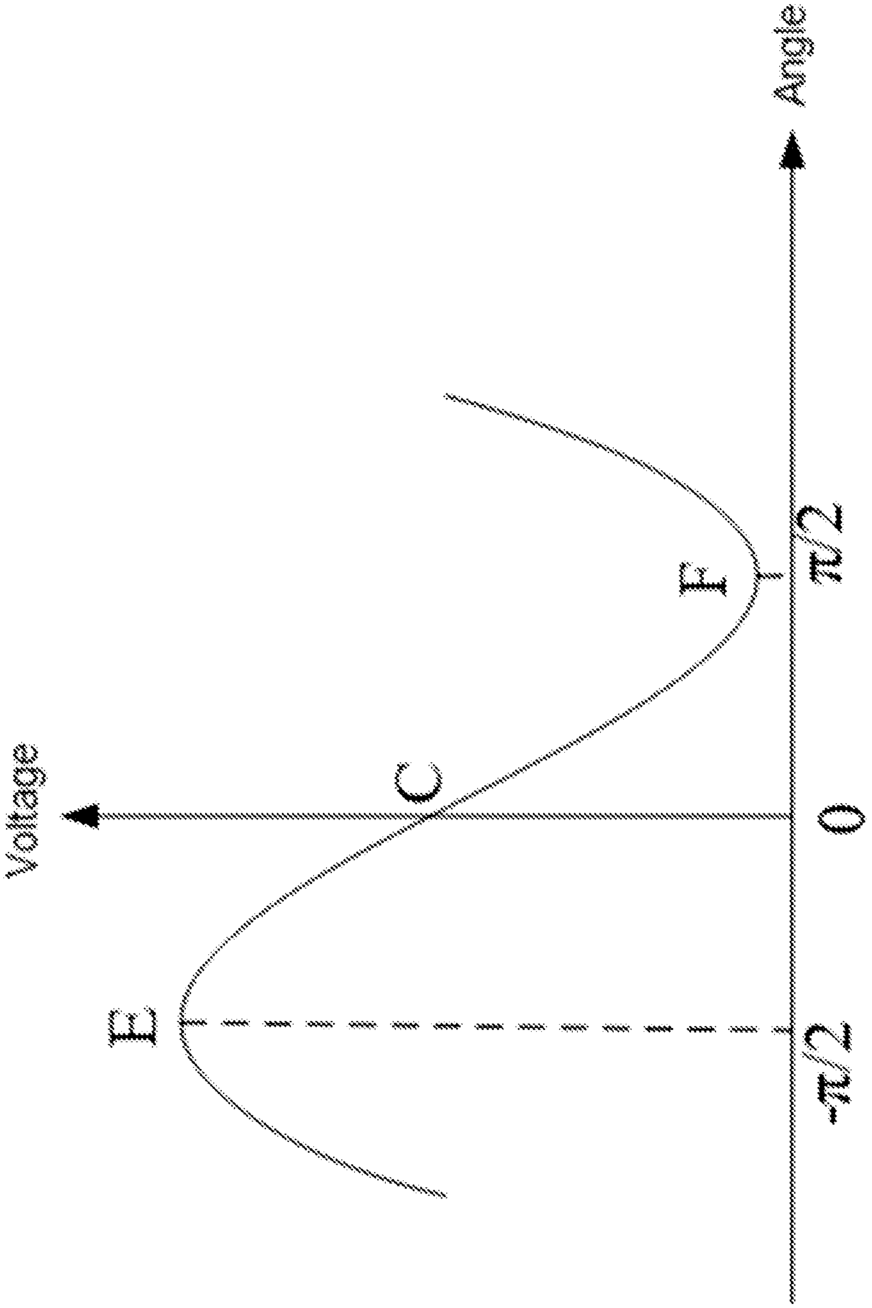
FIG. 10 is a curve chart of an output signal of a magnetic sensor of the galvanometer motor in FIG. 9.

Referring to FIG. 9, when the rotating shaft 210 is at the first limit position or the second limit position, the magnetic sensor 310 is mounted on the sensor board 300, and the central angle formed at the interfaces of the magnetic sensor 310 and the pair of magnetic poles 211 is 90°. The magnetic sensor 310 is disposed relative to a point of one magnetic pole 211 that is farthest from the other magnetic pole 211. Referring to FIG. 10, when the central angle formed at the interfaces of the magnetic sensor 310 and the pair of magnetic poles 211 is 90 degrees, the output signal of the magnetic sensor 310 is a peak E or a peak F, and the rotating shaft 210 rotates by 90° in a specific rotating direction, that is, an abscissa of the peak E or the peak F in FIG. 10 is shifted leftward by $\pi/2$ or rightward by $\pi/2$, which still fall within the monotonic interval of the sinusoidal function relationship, so that the output signals of the magnetic sensor 310 are in a one-to-one correspondence with the angles of the rotating shaft 210.

In another example, because the rotating angle of the rotating shaft 210 is less than 90°, when the rotating shaft 210 is at the first limit position or the second limit position, a central angle is not necessarily formed at the interfaces of the magnetic sensor 310 and the pair of magnetic poles 211, provided that the angle of the rotating shaft 210 falls within the monotonic interval of the sinusoidal function relationship when rotating in a limited angle.

Figure 5:
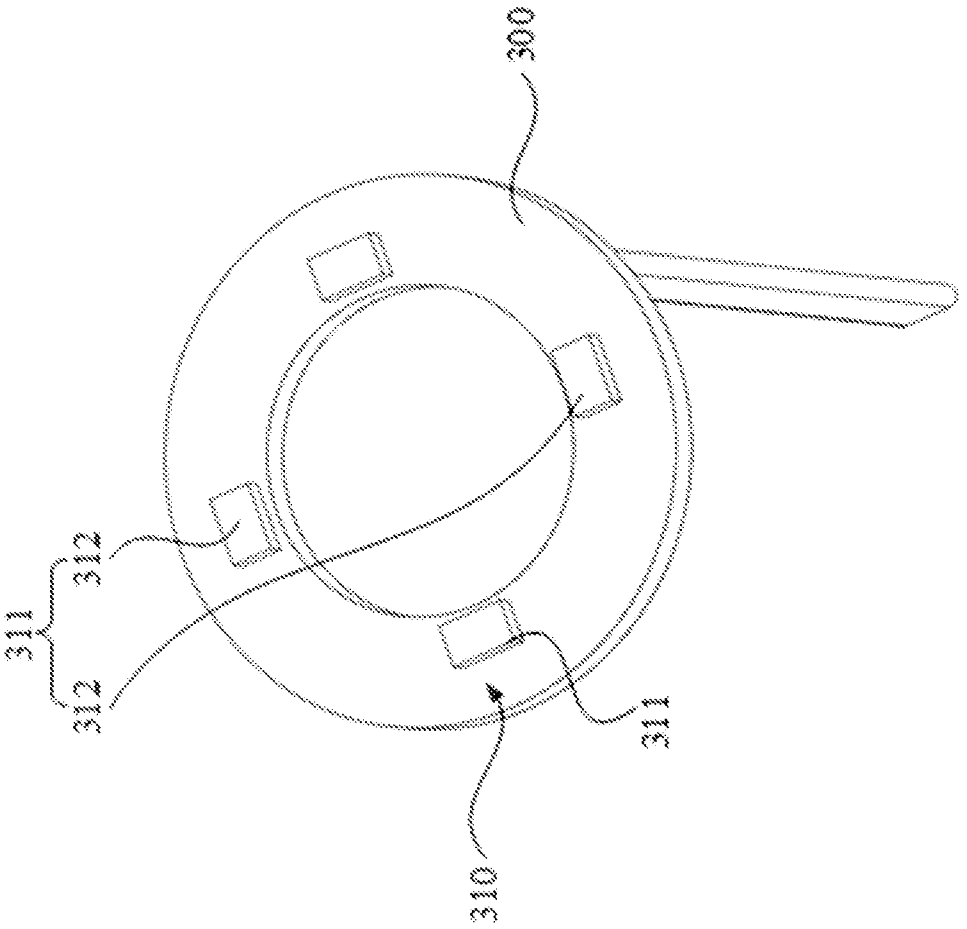
FIG. 5 is a schematic structural diagram of the sensor board in FIG. 4.

In some embodiments, referring to FIG. 5, a number of the magnetic sensors 310 is greater than two, and a phase difference between any two magnetic sensors 310 is greater than 0° and less than 180°. At this time, an output signal of each magnetic sensor 310 has a sinusoidal function relationship with an angle of the rotating shaft 210, and two sinusoidal curves (refer to a curve A and a curve B in FIG. 6) are obtained through more than two magnetic sensors 310, which implements mutual-correction and backup effects, so that the rotating angle of the rotating shaft 210 can be uniquely determined and the absolute positions of the rotating shaft 210 and the galvanometer lens 220 can be further obtained. The angle of the rotating shaft 210 between the first limit position and the second limit position does not need to correspond to the monotonic interval of the sinusoidal function relationship, that is, there is no need to consider the relative positions of the magnetic sensor 310 and the magnetic pole 211 during mounting, which further reduces the difficulty in mounting and improves the yield.

Generally, the number of magnetic sensors 310 is two or three. For example, referring to FIG. 6, the number of magnetic sensors 310 is two. Herein, two magnetic sensors 310 may be mounted at any position on the sensor board 300, and can determine the angle of the rotating shaft 210, to meet a requirement of measuring the absolute position of the galvanometer lens 220. Therefore, the number of components of the galvanometer motor can be reduced, and the mounting difficulty and costs of the galvanometer motor can be reduced by using as few magnetic sensors 310 as possible.

In another embodiment of this application, the magnetic sensor 310 is a Hall sensor, an MR (Magneto Resistance) sensor, or an MI (Magneto Impedance) sensor.

Referring to FIG. 5, the magnetic sensor 310 includes a differential Hall sensor group 311. The differential Hall sensor group 311 includes two differential Hall sensing units 312, and a phase difference between the two differential Hall sensing units 312 is 180°. Two differential Hall sensing units 312 of the differential Hall sensor group 311 are disposed opposite each other on the sensor board 300, to form a differential signal, which prevents one differential Hall sensing unit 312 from being interfered with by an ambient magnetic field and improves an anti-interference capability of the signal, thereby improving accuracy of the magnetic sensor 310 and improving reliability of the galvanometer motor.

In an embodiment, the pair of radially magnetized magnetic poles 211 are cylindrical. One magnetic pole 211 is an S pole and the other magnetic pole 211 is an N pole. The magnetic pole 211 is a permanent magnet.

In an embodiment, referring to FIG. 1 and FIG. 2, the first restrictive member 111 is on an outer wall on one end of the housing 110 that is closer to the galvanometer lens 220. The first restrictive member 111 is disposed on the outer wall of the housing 110, which facilitates restrictive fitting of the first restrictive member 111 and the second restrictive member 212 during manufacture, thereby reducing mounting difficulty and improving the yield rate.

Herein, the galvanometer lens 220 rotates when driven by the rotating shaft 210, the galvanometer lens 220 belongs to the rotor 200, the housing 110 belongs to the stator 100, and there is a gap there between, to prevent the galvanometer lens 220 from rubbing the stator 100 during rotation. The first restrictive member 111 is at one end of the housing 110 that is closer to the galvanometer lens 220, to implement mounting by making full use of the gap between the housing 110 and the galvanometer lens 220, thereby restricting the galvanometer lens 220 without increasing a volume of the galvanometer motor.

Referring to FIG. 1, rotation regions of the first restrictive member 111 and the galvanometer lens 220 are staggered on one end surface of the housing 110. The galvanometer lens 220 does not touch the first restrictive member 111 during rotation, and therefore, the galvanometer lenses 220 do not need to be staggered mutually on the axis of the rotating shaft 210 to avoid the first restrictive member 111. Length of an end of the rotating shaft 210 that protrudes from the housing 110 can be shortened as much as possible to meet a mounting requirement of the galvanometer lens 220, thereby reducing length of the galvanometer motor.

In another embodiment, the first restrictive member 111 and the second restrictive member 212 may also be located inside the housing 110, or may be at one end of the housing 110 that is farther away from the galvanometer lens 220.

Referring to FIG. 1, the number of first restrictive members 111 is two. The two first restrictive members 111 are disposed opposite each other, and the second restrictive members 212 are in a one-to-one correspondence with the first restrictive members 111. The number of second restrictive members 212 is also two, each second restrictive member 212 restricts and fits a corresponding first restrictive member 111. In this way, two restrictive forces are applied by the housing 110 to the rotating shaft 210, which can apply a more uniform and proper force on the rotating shaft 210, thereby improving reliability of the galvanometer motor.

In some embodiments, the two first restrictive members 111 are disposed opposite each other, so that the restrictive force of the rotating shaft 210 is symmetrical, which facilitates smooth rotation of the rotating shaft 210 within a small angle.

Referring to FIG. 1 and FIG. 2, the first restrictive member 111 comprises two restrictive blocks 112 disposed at one end of the housing 110 that is closer to the galvanometer lens 220, and the two restrictive blocks 112 are disposed at intervals. The second restrictive member 212 comes into contact with one restrictive block 112 when the rotating shaft 210 rotates to the first limit position, to stop the rotating shaft 210 from rotating continuously. The second restrictive member 212 comes into contact with the other restrictive block 112 when the rotating shaft 210 rotates to the second limit position, to stop the rotating shaft 210 from rotating continuously, so that the rotating shaft 210 rotates within a limited angle between the first limit position and the second limit position.

Herein, a restrictive groove 113 is formed between the two restrictive blocks 112, and the second restrictive member 212 rotates within a limited angle within the restrictive groove 113.

The first restrictive member 111 further includes a connecting wall 114 convexly disposed at one end of the housing 110, and two ends of the connecting wall 114 each are connected to one end of the two restrictive blocks 112 that is farther away from the rotating shaft 210.

In this embodiment, the second restrictive member 212 is a restrictive pin.

In another implementation of this embodiment, referring to FIG. 2 and FIG. 3, the galvanometer motor further includes two bearings 400. The two bearings 400 are mounted at two ends of the housing 110 separately and sleeved on the rotating shaft 210, and provide rotating support for the rotating shaft 210 from the two ends of the rotating shaft 210, which improves a support effect, so that the rotating shaft 210 and the galvanometer lens 220 rotate more smoothly.

Herein, the drive coil 120, the magnetic pole 211, the sensor board 300, and the magnetic sensor 310 are all between the two bearings 400, so that a structure of the galvanometer motor is compact.

With reference to FIG. 3, the drive coil 120 is directly fixed around the inner wall of the housing 110.

For example, the drive coil 120 is bonded to the inner wall of the housing 110, thereby avoiding increasing a diameter of the housing 110.

A relatively sealed cylindrical cavity is formed inside the housing 110, and the pair of magnetic poles 211 are cylindrical and arranged in the cylindrical cavity, and have a fitting shape and a compact structure. In an axis direction of the rotating shaft 210, length of the pair of magnetic poles 211 and length of the drive coil 120 are equal, or a difference there between is less than 1 mm. Most of a side surface region of the pair of radially magnetized magnetic pole 211 is configured to interact with electromagnetic force of the drive coil 120, which maximizes an interaction area, so that smaller diameters of the housing 110 and the pair of magnetic poles 211 can be designed.

The sensor board 300 is mounted on an inner side of the housing 110 that is farther away from the end of the galvanometer lens 220, the sensor board 300 is a circular board, and a through hole through which the end of the rotating shaft 210 penetrates is at the middle of the sensor board 300, so that the end of the rotating shaft 210 is mounted on the bearing 400. Projection of the sensor board 300 and projection of the pair of magnetic poles 211 in the axis direction of the rotating shaft 210 are basically overlapped. The magnetic sensor 310 is mounted on a side surface of the sensor board 300 that is closer to the magnetic pole 211, and the magnetic sensor 310 and rears of the pair of magnetic poles 211 are disposed opposite each other at a small distance, thereby improving detection accuracy of the magnetic sensor 310 and improving reliability of the galvanometer motor.

In an example, referring to FIG. 1 and FIG. 2, the housing 110 includes a housing body 115 and a rear cover 116. An end of the housing body 115 is open, so that the drive coil 120 and the rotating shaft 210 can be mounted inside the housing body 115. The rear cover 116 is removably mounted at an open end of the housing body 115, the sensor board 300 is fixed on the inner side of the rear cover 116, and an end of the rotating shaft 210 is rotatably mounted on the rear cover 116 via the bearing 400.

In some embodiments, the rear cover 116 has a wire outlet 117, and a connection terminal 121 of the drive coil 120 and a lead wire 320 of the sensor board 300 are electrically connected to an external drive board through the wire outlet 117. The drive board is configured to provide an alternating current for the drive coil 120, and obtain the output signal of the magnetic sensor 310. In this way, the drive board is disposed outside the galvanometer motor, which avoids occupying internal space of the housing 110 and further reduces the volume of the housing 110, so that the structure of the galvanometer motor is more compact.

Herein, a number of wire outlets 117 may be one, the connection terminal 121 of the drive coil 120 and the lead wire 320 of the sensor board 300 are extended from the same wire outlet 117 to outside of the galvanometer motor. A number of wire outlets 117 may be two, the connection terminal 121 of the drive coil 120 and the lead wire 320 of the sensor board 300 are extended from different wire outlets 117 separately to outside of the galvanometer motor.

In an embodiment of another aspect of this application, referring to FIG. 11 to FIG. 13, a galvanometer motor includes a stator 100, a rotor 200 and an angular position sensor 3001, the stator 100 includes a housing 110, and a drive coil 120 and a calibration coil 4001 mounted inside the housing 110, and the drive coil 120 is configured to be connected to an alternating current and generate a rotating magnetic field. In some embodiments, a number of connection terminals 121 of the drive coil 120 is two, the drive coil 120 has two connection terminals 121 connected to the alternating current, and the alternating current is input as a control signal in a direction. There is a gap between the stator 100 and the rotor 200. The rotor 200 includes a rotating shaft 210 and a galvanometer lens 220, two ends of the rotating shaft 210 are rotatably mounted inside the housing 110, and one end of the rotating shaft 210 extends outside the housing 110 and is connected to the galvanometer lens 220. A pair of radially magnetized magnetic poles 211 are at the middle of the rotating shaft 210, and the pair of magnetic poles 211 rotate under action of the rotating magnetic field to drive the entire rotor 200 to rotate. The pair of magnetic poles 211 not only can rotate in the rotating magnetic field generated by the drive coil 120, but also can generate the magnetic field signal that can be directly sensed by the angular position sensor 3001 to obtain the angular position of the rotating shaft 210, without a need of mounting an additional feedback sensor on the rotating shaft 210, which implements a compact structure, thereby facilitating a reduction in difficulty in mounting the galvanometer motor, reducing a volume of the galvanometer motor, and improving yield of the galvanometer motor.

In some embodiments, the drive coil 120 is wound to form a hollow winding. The drive coil 120 has no iron core inside, can reduce a moment of inertia and inductance of the galvanometer motor, and has characteristics of small inductance and a small back electromotive force, thereby changing the control signal more quickly and improving a response speed.

The angular position sensor 3001 is fixed on the inner wall of the housing 110, and the angular position sensor 3001 is configured to detect an angular position of the rotor 200, thereby accurately controlling the rotating angle of the galvanometer lens 220. An ordinary angular position sensor 3001 is susceptible to temperature drift when affected by temperature, thereby causing offset in a measured angular position of the rotor 200.

In order to calibrate the offset of the angular position sensor 3001, in this embodiment, the calibration coil 4001 is mounted in the housing 110 and located on a periphery of the pair of magnetic poles 211, and the calibration coil 4001 is configured to sample the back electromotive force generated by the pair of magnetic poles 211 to obtain the offset of the angular position sensor 3001 when the back electromotive force crosses zero. The corresponding actual angular position when the back electromotive force sampled by the calibration coil 4001 crosses zero is compared with the angular position measured by the angular position sensor 3001 at this time, to obtain the offset there between, which can accurately obtain the offset of the angular position sensor 3001 and further continuously calibrate the angular position sensor 3001 during operation, thereby improving control accuracy of the galvanometer motor and facilitating control over the costs and volume of the galvanometer motor.

As shown in FIG. 14, in a back electromotive force zero-crossing detection method, the pair of magnetic poles 211 rotate, and the calibration coil 4001 cuts through the magnetic induction line of the pair of rotating magnetic poles 211, to generate a back electromotive force in the calibration coil 4001. A relationship between the back electromotive force generated by the calibration coil 4001 and the rotating angle of the pair of magnetic poles 211 is shown in FIG. 15, and an instantaneous value of the back electromotive force is directly proportional to a rate of change of magnetic flux. When the position relationship between the pair of magnetic poles 211 and the calibration coil 4001 is shown in FIG. 14, the magnetic flux of the calibration coil 4001 has a maximum value at this time, that is, the rate of change of the magnetic flux is 0, and the back electromotive force generated by the calibration coil 4001 is 0. In other words, when the back electromotive force generated by the calibration coil 4001 is 0, relative positions of the calibration coil 4001 and the pair of magnetic poles 211 are determined, and because the position of the calibration coil 4001 remains unchanged, the actual angular position of the pair of magnetic poles 211 is determined at this time. Based on comparison between the actual angular position of the pair of magnetic poles 211 and the angular position of the pair of magnetic poles 211 that is measured by the angular position sensor 3001, the offset of the angular position sensor 3001 can be learned, so that the angular position sensor 3001 is calibrated each time the back electromotive force of the calibration coil 4001 is 0 during operation, thereby improving measurement accuracy of the angular position sensor 3001 and improving the accuracy of the galvanometer motor. It can be understood that the value of the back electromotive force generated by the calibration coil is not limited to zero, and when the back electromotive force generated by the calibration coil is a value rather than zero, a reverse calculation analysis can be performed, to calibrate the position of the angular position sensor.

In some embodiments, with reference to FIG. 14, the drive coil 120 and the calibration coil 4001 are disposed at intervals along a circumferential direction of the pair of magnetic poles 211, thereby avoiding overlapping of the drive coil 120 and the calibration coil 4001 in the radial direction of the rotor 200, thereby reducing a diameter and a volume of the galvanometer motor. The drive coil 120 and the calibration coil 4001 are fixed on the inner wall of the housing 110, and there is an air gap between the drive coil 120, the calibration coil 4001 and the pair of magnetic poles 211.

In an example, the drive coil 120 is the drive winding, the calibration coil 4001 is the calibration winding, drive windings are on two opposite sides of the axis of the rotating shaft 210, to better drive the pair of magnetic poles 211 to rotate. In an example, the calibration windings are on the other two opposite sides of the axis of the rotating shaft 210 to more accurately detect the back electromotive force of the pair of magnetic poles 211. As shown in FIG. 14, on a cross section perpendicular to the axis of the rotating shaft 210, the drive coil 120 is on a d axis of the rotating shaft 210, and the calibration coil 4001 is on a q axis of the rotating shaft 210.

In some embodiments, the first central angle B formed by the drive winding and the calibration winding relative to the axis of the rotating shaft 210 is 80° to 100°, that is, an included angle B between the drive coil 120 in a lower part of FIG. 14 and the calibration coil 4001 on the right side of FIG. 14 is 80° to 100°. Therefore, the distance between the drive coil 120 and the calibration coil 4001 in a circumferential direction of the rotating shaft 210 is as large as possible, so that volumes of the drive coil 120 and the calibration coil 4001 are as large as possible, to more sensitively drive the pair of magnetic poles 211 to rotate and detect the back electromotive force generated by the pair of magnetic poles 211.

In an example, the first central angle B is 90°, that is, the d axis and the q axis are perpendicular to each other, and at this time, the drive coil 120 and the calibration coil 4001 are maximum spaced in the circumferential direction of the rotating shaft 210 and form an orthogonal relationship. It can be understood that in another embodiment, the first central angle B is 80°, 85°, 95° or 100°.

In some examples, a first central angle B formed by the drive coil 120 and the calibration coil 4001 relative to the axis of the rotating shaft 210 may be 40° to 80° or 100° to 130°. For example, the first central angle B is 40°, 60°, 120° or 130°.

In some examples, referring to FIG. 11 to FIG. 13, the housing 110 includes a housing body 115 and a rear cover 1121. An end of the housing body 115 is open, so that the drive coil 120 and the rotating shaft 210 can be mounted inside the housing body 115. The rear cover 1121 is removably mounted on an open end of the housing body 115, and the angular position sensor 3001 is fixed on the rear cover 1121.

For example, the rear cover 1121 has a wire outlet 1131, and a connection terminal 121 of the drive coil 120, a wire of the calibration coil 4001 and a lead wire 340 of the angular position sensor 3001 are electrically connected to an external control board through the wire outlet 1131. The control board is configured to provide an alternating current for the drive coil 120, and obtain a back electromotive force generated by the calibration coil 4001 and the output signal of the angular position sensor 3001. In this way, the control board is disposed outside the galvanometer motor, which avoids occupying internal space of the housing 110 and further reduces the volume of the housing 110, so that the structure of the galvanometer motor is more compact.

Herein, a number of wire outlets 1131 may be one, the connection terminal 121 of the drive coil 120, the wire of the calibration coil 4001 and the lead wire 340 of the angular position sensor 3001 are extended from the same wire outlet 1131 to outside of the galvanometer motor. A number of wire outlets 1131 may be three, the connection terminal 121 of the drive coil 120, the wire of the calibration coil 4001 and the lead wire 340 of the angular position sensor 3001 are extended from different wire outlets 1131 separately to outside of the galvanometer motor.

In some embodiments, referring to FIG. 11 and FIG. 12, the housing 110 is mounted with two first restrictive members 130 distributed at intervals, a second central angle formed by the first restrictive members 130 relative to the axis of the rotating shaft 210 is to 80°, the rotating shaft 210 is connected to a second restrictive member 230, and the second restrictive member 230 is located between the two first restrictive members 130. The second restrictive member 230 can swing between two first restrictive members 130, thereby limiting a rotating angle range of the rotating shaft 210. Herein, the second restrictive member 230 restricts and abuts one first restrictive member 130, the rotor 200 is at the first limit angle, the second restrictive member 230 restricts and abuts the other first restrictive member 130, and the rotor 200 is at the second limit angle.

In an example, the galvanometer motor limits the rotating angle of the galvanometer lens 220 within 80°, which helps quickly determine a rotating angle of the rotating shaft 210 relative to an initial position within a limited rotating angle based on an output signal of the Hall sensor 3201, thereby determining absolute positions of the rotating shaft 210 and the galvanometer lens 220.

In some embodiments, the second central angle formed by the two first restrictive members 130 relative to the axis of the rotating shaft 210 is 6°, 10°, 15°, 20°, 40°, or 50°.

In an example, two first restrictive members 130 form a restrictive groove 131, and the second restrictive member 230 is located in the restrictive groove 131. One end of the two first restrictive members 130 that is farther away from the axis of the rotating shaft 210 is connected via a connection arm 140. The first restrictive member 130 is on an end surface of the housing 110 that is closer to the galvanometer lens 220. The two first restrictive members 130 form a restrictive portion, and the housing 110 has two such restrictive portions, where the two first restrictive members 130 and the other two first restrictive members 130 are disposed opposite each other, and correspondingly, the rotating shaft 210 is connected to two second restrictive members 230.

In an example, when a back electromotive force crosses zero, the second restrictive member 230 is located on an angle bisector of the second central angle. In other words, a position relationship between the pair of magnetic poles 211, the drive coil 120 and the calibration coil 4001 is shown in FIG. 14. As shown in FIG. 11, the second restrictive member 230 is in the middle of the two first restrictive members 130.

In an embodiment, with reference to FIG. 14, the pair of radially magnetized magnetic poles 211 are cylindrical. One magnetic pole 211 is an S pole and the other magnetic pole 211 is an N pole. The magnetic pole 211 is a permanent magnet.

Referring to FIG. 11, rotation regions of the first restrictive member 130 and the galvanometer lens 220 are staggered on one end surface of the housing 110. The galvanometer lens 220 does not touch the first restrictive member 130 during rotation, and therefore, the galvanometer lenses 220 do not need to be staggered mutually on the axis of the rotating shaft 210 to avoid the first restrictive member 130. Length of an end of the rotating shaft 210 that protrudes from the housing 110 can be shortened as much as possible, thereby reducing length of the galvanometer motor.

In another embodiment, the first restrictive member 130 and the second restrictive member 230 may also be located inside the housing 110, or may be at one end of the housing 110 that is farther away from the galvanometer lens 220.

In an embodiment, the second restrictive member 230 is a restrictive pin.

In an implementation of this embodiment, referring to FIG. 12 and FIG. 13, the galvanometer motor further includes two bearings 500. The two bearings 500 are mounted at two ends of the housing 110 separately and sleeved on the rotating shaft 210, and provide rotating support for the rotating shaft 210 from the two ends of the rotating shaft 210, which improves a support effect, so that the rotating shaft 210 and the galvanometer lens 220 rotate more smoothly.

Herein, the drive coil 120, the magnetic pole 211, the circuit board 330 and the Hall sensor 3201 are all between the two bearings 500, so that the structure of the galvanometer motor is compact.

With reference to FIG. 13, the drive coil 120 is directly fixed around the inner wall of the housing 110.

For example, the drive coil 120 is bonded to the inner wall of the housing 110, without a need for an additional auxiliary mounting structure, thereby avoiding increasing a diameter of the housing 110.

A relatively sealed cylindrical cavity is formed inside the housing 110, and the pair of magnetic poles 211 are cylindrical and arranged in the cylindrical cavity, and have a fitting shape and a compact structure. In an axis direction of the rotating shaft 210, length of the pair of magnetic poles 211 and length of the drive coil 120 are equal, or a difference there between is less than 1 mm. Most of a side surface region of the pair of radially magnetized magnetic pole 211 is configured to interact with electromagnetic force of the drive coil 120, which maximizes an interaction area, so that diameters of the housing 110 and the pair of magnetic poles 211 can be smaller.

The circuit board 330 is mounted on an inner side of the housing 110 that is farther away from the end of the galvanometer lens 220, the circuit board 330 is a circular board, and a through hole through which the end of the rotating shaft 210 penetrates is at the middle of the circuit board 330, so that the end of the rotating shaft 210 is mounted on the bearing 500. Projection of the circuit board 330 and projection of the pair of magnetic poles 211 in the axis direction of the rotating shaft 210 are basically overlapped. The Hall sensor 3201 is mounted on a side surface of the circuit board 330 that is closer to the magnetic pole 211, and the Hall sensor 3201 and rears of the pair of magnetic poles 211 are disposed opposite each other at a small distance, thereby improving detection accuracy of the Hall sensor 3201 and improving reliability of the galvanometer motor.

In some embodiments, with reference to FIG. 16 and FIG. 17, the angular position sensor 3001 is an encoding disk 3101, the encoding disk 3101 includes a reflection portion 3111 and a light emission portion 3121, and the light emission portion 3121 and the reflection portion 3111 can cooperate to transmit angular position information. The reflection portion 3111 is mounted on an inner surface of the rear cover 1121, the reflection portion 3111 includes multiple reflection portion 3111 that are extended in a direction of approaching the rotating shaft 210 and that are spaced apart from each other, the reflection portion 3111 are disposed along a common arc, and the arc extends around the axis of the rotating shaft 210. The light emission portion 3121 is mounted on the end of the rotating shaft 210 that is closer to the rear cover 1121, and the light emission portion 3121 is configured to emit and receive measurement light. The measurement light can be laser, infrared rays, ultraviolet rays, or the like. When a light emission portion 3121 rotates along with the rotating shaft 210 relative to the rear cover 1121, and the light emission portion 3121 obtains a rotating angle of the reflection portion 3111 relative to the light emission portion 3121 by obtaining the number of teeth of the reflection portion 3111 that are scanned by the measurement light.

In an embodiment, the measurement light of the light emission portion 3121 is directed to the reflection portion 3111, and if the measurement light is directed to the reflection portion 3111, the reflected measurement light is received by the light emission portion 3121. For example, when the measurement light is directed to the gap between the two reflection portion 3111, the measurement light is not reflected, but still received by the light emission portion 3121. However, the reception portions of the foregoing two types of measurement light are different, and therefore, whether the measurement light is directed to the reflection portion 3111 based on the reception portion of the measurement light may be determined. When the rotating shaft 210 rotates, a light reflection portion rotates along with the rotating shaft 210, and the measurement light continuously scans across the reflection portion 3111. The light emission portion 3121 obtains a rotating angle of the reflection portion 3111 relative to the light emission portion 3121 by obtaining the number of teeth of the reflection portion 3111 that are scanned by the measurement light.

In order that the light emission portion 3121 receives both measurement light reflected by the reflection portion 3111 and measurement light that is not reflected by the reflection portion 3111, the light emission portion 3121 may have a first working body 31211 and a second working body 3122 disposed opposite each other. The first working body 31211 is configured to emit and receive the measurement light, the second working body 3122 is configured to receive the measurement light, and the reflection portion 3111 are disposed between the first working body 31211 and the second working body 3122. When the measurement light is reflected by the reflection portion 3111, the first working body 31211 receives the reflected measurement light; or when the measurement light is not reflected by the reflection portion 3111, the second working body 3122 receives the measurement light.

In an embodiment, the reflection portion 3111 may only include reflection portion 3111, and the reflection portion 3111 of the reflection portion 3111 may be integrated with the end wall of the rear cover 1121, without requiring additional processing of the reflection portion 3111 or requiring a mounting process of the reflection portion 3111. In another embodiment, the reflection portion 3111 may also be mounted on the end wall of the rear cover 1121 one to one.

In an embodiment, the reflection portion 3111 may also include a connection member 3112, and the connection member 3112 is connected to the end wall of the rear cover 1121 via a threaded connection. The reflection portion 3111 extend along the end wall of the connection member 3112 that is farther away from the rear cover 1121 in the direction of approaching the rotating shaft 210. That is, the reflection portion 3111 is connected to an end wall of the rear cover 1121 via the connection member 3112, and the reflection portion 3111 are connected to the connection member 3112, so that the reflection portion 3111 are fixed on the rotating shaft 210. The connection member 3112 and the reflection portion 3111 are integrated, and when the reflection portion 3111 is mounted, a mounting member is mounted on the end wall of the rear cover 1121 by using a threaded fastener.

The connection member 3112 may be strip-shaped or bent into an arc shape. In addition, the central angle of the arc-shaped connection member 3112 may be determined based on an arrangement position of the reflection portion 3111. For example, the connection member 3112 is a circular box, the connection member 3112 extends around a rotating axis, and the center of the connection member 3112 is on the axis of the rotating shaft 210. With such a structure, when the rotating shaft 210 rotates, a relative distance between each reflection tooth 31111 reflecting the measurement light and the light emission portion 3121 can remain unchanged. When the reflection portion 3111 extend between the first working body 31211 and the second working body 3122 of the light emission portion 3121, regardless of how small the rotating angle of the rotating shaft 210 is, a relative distance from the reflection portion 3111 for reflecting the measurement light to the first working body 31211 and the second working body 3122 remains unchanged, so that paths of the measurement light reflected back by the reflection portion 3111 are basically the same, thereby facilitating receiving of the reflected measurement light.

In some embodiments, with reference to FIG. 18 to FIG. 20, the angular position sensor 3001 is a Hall sensor 3201, and the Hall sensor 3201 measures an angular position of the rotor 200 by sensing a magnetic field signal of the pair of magnetic poles 211. The Hall sensor 3201 is mounted inside the rear cover 1121, which facilitates a reduction in the volume of the galvanometer motor.

The output signal of the Hall sensor 3201 has a sinusoidal function relationship with an angle of the rotating shaft 210, and the Hall sensor 3201 generates one complete sine wave when the rotating shaft 210 rotates by one turn. The sinusoidal function relationship in this application indicates that the output signal y of the Hall sensor 3201 and the angle x of the rotating shaft 210 satisfy the sinusoidal function analytical formula $y=A\sin(\omega x+\varphi)+h$, where parameters A, $\omega$, $\varphi$ and h are determined based on specific scenarios.

In an embodiment, the angle of the rotating shaft 210 between the first limit angle and the second limit angle corresponds to a monotonic interval of the sinusoidal function relationship, and output signals y of the Hall sensor 3201 are in a one-to-one correspondence with angles x of the rotating shaft 210, the unique angle x of the rotating shaft 210 is obtained based on the output signals y of the Hall sensor 3201. For example, referring to FIG. 20, a dotted box is within a monotonic interval of a curve B other than a monotonic interval of a curve A.

In an example, the position relationship between the Hall sensor 3201 and the magnetic pole 211 is limited, the angle of the rotating shaft 210 between the first limit angle and the second limit angle corresponds to the monotonic interval of the sinusoidal function relationship.

For example, referring to FIG. 21, when the rotating shaft 210 is at the initial position, the Hall sensor 3201 is mounted on the rear cover 1121 via the circuit board 330, and interfaces of the Hall sensor 3201 and the pair of magnetic poles 211 are in the same radial direction of the rotating shaft 210. In other words, the rotating angle of the rotating shaft 210 is 0 degrees, and interfaces of the Hall sensor 3201 and the pair of magnetic poles 211 are disposed opposite each other. As shown in FIG. 8, because magnetic field intensity at the interface of the pair of magnetic poles 211 is the minimum, at this time, the output signal of the Hall sensor 3201 is an average value of the sine wave (refer to a point C in FIG. 8), and the rotating shaft 210 rotates within ±45°, which is within the monotonic interval of the sinusoidal function relationship, so that the output signals of the Hall sensor 3201 are in a one-to-one correspondence with the angles of the rotating shaft 210. The relative position relationship between the Hall sensor 3201 and the pair of magnetic poles 211 at initial positions is limited, so that the angle of the rotating shaft 210 between the first limit angle and the second limit angle corresponds to the monotonic interval of the sinusoidal function relationship.

As the rotating angle of the rotating shaft 210 is less than 80°, in another example, provided that the angle of the rotating shaft 210 falls within the monotonic interval of the sinusoidal function relationship when rotating within the rotating angle range, when the rotating shaft 210 is at the initial position, the interfaces of the Hall sensor 3201 and the pair of magnetic poles 211 are not necessarily in the same radial direction of the rotating shaft 210. For example, the rotating angle of the rotating shaft 210 is $\pm\pi/6$. When the rotating angle of the rotating shaft 210 is 0 degrees, it is only required that the central angle formed between the interfaces of the Hall sensor 3201 and the pair of magnetic poles 211 does not exceed $\pm\pi/3$. Referring to FIG. 12, when the rotating shaft 210 is at the initial position, an abscissa is within an interval D, and the interval D moves leftward and rightward by $\pi/6$, which still corresponds to the monotonic interval of the sinusoidal function relationship. That is, the output signals of the Hall sensor 3201 are in a one-to-one correspondence with the angles of the rotating shaft 210.

For example, referring to FIG. 22, when the rotating shaft 210 is at the first limit angle or the second limit angle, the Hall sensor 3201 is mounted on the circuit board 330, and the central angle formed at the interfaces of the Hall sensor 3201 and the pair of magnetic poles 211 is 90°. The Hall sensor 3201 is disposed relative to a point of one magnetic pole 211 that is farthest from the other magnetic pole 211. Referring to FIG. 10, when the central angle formed at the interfaces of the Hall sensor 3201 and the pair of magnetic poles 211 is 90°, the output signal of the Hall sensor 3201 is a peak E or a peak F, and the rotating shaft 210 rotates by 90° in a specific rotating direction, that is, an abscissa of the peak E or the peak F in the figure is shifted leftward by $\pi/2$ or rightward by $\pi/2$, which still fall within the monotonic interval of the sinusoidal function relationship, so that the output signals of the Hall sensor 3201 are in a one-to-one correspondence with the angles of the rotating shaft 210.

In another example, because the rotating angle of the rotating shaft 210 is less than 80°, when the rotating shaft 210 is at the first limit angle or the second limit angle, a 90° central angle is not necessarily formed at the interfaces of the Hall sensor 3201 and the pair of magnetic poles 211.

In some embodiments, referring to FIG. 19, a number of the Hall sensors 3201 is more than two, and a phase difference between any two Hall sensors 3201 is greater than 0° and less than 180°. At this time, an output signal of each Hall sensor 3201 has a sinusoidal function relationship with an angle of the rotating shaft 210, and two sinusoidal curves (refer to a curve A and a curve B in FIG. 10) are obtained through more than two Hall sensors 3201, which implements mutual-correction and backup effects, so that the rotating angle of the rotating shaft 210 can be uniquely determined and the absolute positions of the rotating shaft 210 and the galvanometer lens 220 can be further obtained, which further reduces the difficulty in mounting and improves the yield.

Generally, a number of Hall sensors 3201 is two or three. For example, referring to FIG. 19, a number of Hall sensors 3201 is two. Herein, two Hall sensors 3201 may be mounted at any position on the circuit board 330, and can uniquely determine the angle of the rotating shaft 210, to meet a requirement of measuring the absolute position of the galvanometer lens 220. Therefore, the number of components of the galvanometer motor can be reduced, and the mounting difficulty and costs of the galvanometer motor can be reduced by using fewer Hall sensors 3201.

Referring to FIG. 19, the Hall sensor 3201 includes a differential Hall sensor group 321. The differential Hall sensor group 321 includes two differential Hall sensing units 322, and a phase difference between the two differential Hall sensing units 322 is 180°. Two differential Hall sensing units 322 of the differential Hall sensor group 321 are disposed opposite each other on the circuit board 330, to form a differential signal, which improves an anti-interference capability of the signal, thereby improving accuracy of the Hall sensor 3201 and improving reliability of the galvanometer motor.

With reference to FIG. 23, this application further provides a method for using a galvanometer motor in an embodiment, where the method includes the following steps.

S100. Connect a drive coil 120 to an alternating current to generate a rotating magnetic field, to drive a rotor 200 including a pair of magnetic poles 211 to rotate.

S200. Detect an angular position of the rotor 200 via an angular position sensor 3001.

S300. When the back electromotive force that is sampled by a calibration coil 4001 and that is generated by the pair of magnetic poles 211 crosses zero, make comparison to obtain offset between an actual angular position of the rotor 200 and an angular position detected by the angular position sensor 3001, to calibrate offset of the angular position sensor 3001.

In the foregoing method, the calibration coil 4001 is configured to sample the back electromotive force generated by the pair of magnetic poles 211 to calibrate the offset of the angular position sensor 3001, and further continuously calibrate the angular position sensor 3001 during operation, thereby improving control accuracy of the galvanometer motor and facilitating control over the costs and volume of the galvanometer motor.

In an embodiment, the rotor 200 reciprocates between a first limit angle and a second limit angle, one reciprocating rotation of the rotor 200 is one cycle, and when the rotor 200 rotates from the second limit angle to the first limit angle, step S300 is performed, and the offset of the angular position sensor 3001 is calibrated before the next cycle.

For example, the first limit angle is −30°, the second limit angle is +30°, in a working process of the galvanometer motor, when the galvanometer lens 220 rotates from −30° to +30°, a motor position needs to be accurately controlled for laser scanning, and at this time, the galvanometer motor uses an angular position signal output by the angular position sensor 3001 as a feedback signal. After scanning ends, the galvanometer lens 220 needs to quickly rotate from +30° back to −30° to start a next scanning process. In the process of rotating from +30° back to −30°, a waveform of a back electromotive force induced by the calibration coil 4001 is shown in FIG. 15, and when the rotor 200 rotates to a zero position shown in FIG. 14, a waveform signal of the back electromotive force is 0, and the zero signal can be used to calibrate the angular position sensor 3001, to improve control accuracy by calibrating the offset before the next cycle, that is, before the galvanometer lens 220 rotates from −30° to +30°.

In an example, a corresponding angular position when the back electromotive force that is sampled by a calibration coil 4001 and that is generated by the pair of magnetic poles 211 crosses zero is defined as a starting angle, and an average of the first limit angle and the second limit angle is the starting angle. In an embodiment, the starting angle is 0, at this time, the back electromotive force sampled by the calibration coil 4001 is 0, the first limit angle is $-\theta$, the second limit angle is $+\theta$, where $\theta$ is a positive value, and an average value of the first limit angle and the second limit angle is 0, which is equal to the starting angle.

Therefore, when the back electromotive force sampled by the calibration coil 4001 is 0, an actual angular position of the rotor 200 is 0; if the angular position measured by the angular position sensor 3001 is $+\alpha$, where $\alpha$ is a positive value, offset of the angular position sensor 3001 is $+\alpha$; if the angular position measured by the angular position sensor 3001 is $-\alpha$, offset of the angular position sensor 3001 is $-\alpha$; or if the angular position measured by the angular position sensor 3001 is 0, offset of the angular position sensor 3001 is 0, that is, when the back electromotive force that is sampled by the calibration coil 4001 and that is generated by the pair of magnetic poles 211 crosses zero, the angular position measured by the angular position sensor 3001 is the offset of the angular position sensor 3001, which reduces an offset calculation process, so that the offset of the angular position sensor 3001 can be quickly learned via an algorithm and the angular position sensor 3001 is calibrated.

In another embodiment, the corresponding angular position when the back electromotive force generated by the pair of magnetic poles 211 crosses zero is not a starting angle, for example, 10°; and if the angular position measured by the angular position sensor 3001 is 11°, the offset of the angular position sensor 3001 is 1°; or if the angular position measured by the angular position sensor 3001 is 9°, the offset of the angular position sensor 3001 is −1°. Therefore, based on the angular position when the back electromotive force detected by the calibration coil 4001 is zero, the offset of the angular position sensor 3001 can also be obtained, and the angular position sensor 3001 is calibrated.

What is claimed is:

1. A galvanometer motor, comprising:

a stator, wherein the stator comprises a housing and a drive coil mounted inside the housing;

a rotor, wherein the rotor comprises a rotating shaft and a galvanometer lens, a pair of radially magnetized magnetic poles are at the middle of the rotating shaft, two ends of the rotating shaft are rotatably mounted inside the housing, and one end of the rotating shaft extends outside the housing and is connected to the galvanometer lens; and a sensor board, wherein the sensor board is fixed on an inner wall of the housing and is at one end of the housing that is farther away from the galvanometer lens, the sensor board is mounted with one or more magnetic sensors, and the one or more magnetic sensors are configured to sense a magnetic field signal generated by the pair of magnetic poles, to obtain absolute positions of the rotating shaft and the galvanometer lens, wherein a first restrictive member is mounted on the housing, a second restrictive member is connected to the rotating shaft, and the first restrictive member and the second restrictive member restrict fit each other, wherein a central angle formed by a first limit position, a second limit position, and an axis of the rotating shaft is less than 90°.

2. The galvanometer motor according to claim 1, wherein an output signal of at least one of the one or more magnetic sensors has a sinusoidal function relationship with an angle of the rotating shaft, and an angle of the rotating shaft between the first limit position and the second limit position corresponds to a monotonic interval of the sinusoidal function relationship.

3. The galvanometer motor according to claim 1, wherein a number of the first restrictive member is two, the two first restrictive members are located on an outer wall on one end of the housing that is closer to the galvanometer lens, the two first restrictive members are disposed opposite each other, and one second restrictive member is in a one-to-one correspondence with one first restrictive member.

4. The galvanometer motor according to claim 1, wherein the first restrictive member comprises two restrictive blocks that disposed at one end portion of the housing that is closer to the galvanometer lens, the two restrictive blocks are disposed at intervals.

5. The galvanometer motor according to claim 1, wherein a number of the one or more magnetic sensors is greater than two, and a phase difference between two magnetic sensors is greater than 0° and less than 180°.

6. The galvanometer motor according to claim 1, wherein at least one of the one or more magnetic sensors comprises a differential Hall sensor group, the differential Hall sensor group comprises two differential Hall sensing units, and a phase difference between the two differential Hall sensing units is 180°.

7. The galvanometer motor according to claim 1, wherein the housing comprises a housing body and a rear cover, an end of the housing body is open, the rear cover is detachably mounted on an open end of the housing body, the sensor board is fixed on an inner side of the rear cover, and an end of the rotating shaft is rotatably mounted on the rear cover.

8. The galvanometer motor according to claim 1, wherein the drive coil is wound to form a hollow winding.

9. The galvanometer motor according to claim 1, wherein the galvanometer motor further comprises two bearings, the bearings are mounted at two ends of the housing and sleeved on the rotating shaft, and the drive coil, the pair of magnetic poles, the sensor board, and the one or more magnetic sensors are located between the two bearings.

10. A galvanometer motor, comprising:

a stator, wherein the stator comprises a housing and a drive coil and a calibration coil mounted inside the housing, and the drive coil is configured to connect to an alternating current and generate a rotating magnetic field;

a rotor, wherein the rotor comprises a rotating shaft and a galvanometer lens, a pair of radially magnetized magnetic poles are at the middle of the rotating shaft, the pair of magnetic poles rotate under action of the rotating magnetic field, two ends of the rotating shaft are rotatably mounted inside the housing, and one end of the rotating shaft extends outside the housing and is connected to the galvanometer lens; and an angular position sensor, wherein the angular position sensor is fixed on an inner wall of the housing, and the angular position sensor is configured to detect an angular position of the rotor, wherein the calibration coil is mounted inside the housing and located on an outer periphery of the pair of magnetic poles, and the calibration coil is configured to sample a back electromotive force generated by the pair of magnetic poles to obtain offset of the angular position sensor when the back electromotive force crosses zero.

11. The galvanometer motor according to claim 10, wherein the drive coil and the calibration coil are disposed at intervals along a circumferential direction of the pair of magnetic poles.

12. The galvanometer motor according to claim 11, wherein the drive coil is drive windings, the calibration coil is calibration windings, the drive windings are on two opposite sides of an axis of the rotating shaft, and the calibration windings are on other two opposite sides of the axis of the rotating shaft.

13. The galvanometer motor according to claim 12, wherein a first central angle formed by the drive windings and the calibration windings relative to the axis of the rotating shaft is 80° to 100°.

14. The galvanometer motor according to claim 10, wherein the housing comprises a housing body and a rear cover, an end of the housing body is open, the rear cover is detachably mounted on an open end of the housing body, and the angular position sensor is fixed on the rear cover.

15. The galvanometer motor according to claim 14, wherein the angular position sensor is a Hall sensor, and the Hall sensor is mounted inside the rear cover.

16. The galvanometer motor according to claim 14, wherein the angular position sensor is an encoding disk, the encoding disk comprises a reflection portion and a light emission portion, the reflection portion is mounted on an inner surface of the rear cover, the reflection portion comprises multiple reflection teeth that are extended in a direction of approaching the rotating shaft and that are spaced apart from each other, the reflection teeth are disposed along a common arc, the common arc extends around an axis of the rotating shaft, the light emission portion is mounted on the end of the rotating shaft that is closer to the rear cover, and the light emission portion is configured to emit and receive measurement light; and when the light emission portion rotates along with the rotating shaft relative to the rear cover, the light emission portion obtains a number of reflection teeth scanned by the measurement light, to obtain a rotating angle of the light emission portion relative to the reflection portion.

17. The galvanometer motor according to claim 10, wherein the housing is mounted with two first restrictive members distributed at intervals, a second central angle formed by the two first restrictive members relative to an axis of the rotating shaft is 10° to 80°, the rotating shaft is connected to a second restrictive member, and the second restrictive member is located between the two first restrictive members; and when a back electromotive force crosses zero, the second restrictive member is located on an angle bisector of the second central angle.

* * * * *